US012002885B2

(12) United States Patent
Cheng et al.

(10) Patent No.: US 12,002,885 B2
(45) Date of Patent: Jun. 4, 2024

(54) GATE CONTACT AND VIA STRUCTURES IN SEMICONDUCTOR DEVICES

(71) Applicant: Taiwan Semiconductor Manufacturing Co., Ltd., Hsinchu (TW)

(72) Inventors: Chung-Liang Cheng, Changhua County (TW); Sheng-Tsung Wang, Hsinchu (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 261 days.

(21) Appl. No.: 17/470,548

(22) Filed: Sep. 9, 2021

(65) Prior Publication Data

US 2022/0254927 A1 Aug. 11, 2022

Related U.S. Application Data

(60) Provisional application No. 63/148,198, filed on Feb. 11, 2021.

(51) Int. Cl.
| *H01L 29/78* | (2006.01) |
| *B82Y 10/00* | (2011.01) |
| *H01L 21/285* | (2006.01) |
| *H01L 21/768* | (2006.01) |
| *H01L 21/8234* | (2006.01) |
| *H01L 23/48* | (2006.01) |

(Continued)

(52) U.S. Cl.
CPC .. *H01L 29/7851* (2013.01); *H01L 21/823418* (2013.01); *H01L 21/823431* (2013.01);
(Continued)

(58) Field of Classification Search
CPC ............. H01L 23/481; H01L 21/76805; H01L 21/76831; H01L 21/823475;
(Continued)

(56) References Cited

U.S. PATENT DOCUMENTS

| 9,105,490 B2 | 8/2015 | Wang et al. |
| 9,236,267 B2 | 1/2016 | De et al. |

(Continued)

FOREIGN PATENT DOCUMENTS

| TW | 201730939 A | 9/2017 |
| TW | I715674 B | 1/2021 |
| TW | I716492 B | 1/2021 |

*Primary Examiner* — Sonya McCall-Shepard
(74) *Attorney, Agent, or Firm* — Sterne, Kessler, Goldstein & Fox P.L.L.C.

(57) ABSTRACT

A semiconductor device and methods of fabricating the same are disclosed. The semiconductor device includes a substrate, a fin structure disposed on the substrate, a source/drain (S/D) region disposed on the fin structure, and a gate structure disposed on the fin structure adjacent to the S/D region. The gate structure includes a gate stack disposed on the fin structure and a gate capping structure disposed on the gate stack. The gate capping structure includes a conductive gate cap disposed on the gate stack and an insulating gate cap disposed on the conductive gate cap. The semiconductor device further includes a first contact structure disposed within the gate capping structure and a first via structure disposed on the first contact structure.

20 Claims, 44 Drawing Sheets

(51) Int. Cl.
*H01L 23/485* (2006.01)
*H01L 23/522* (2006.01)
*H01L 27/088* (2006.01)
*H01L 29/06* (2006.01)
*H01L 29/08* (2006.01)
*H01L 29/66* (2006.01)
*H01L 29/775* (2006.01)

(52) U.S. Cl.
CPC ........ *H01L 23/481* (2013.01); *H01L 29/0847* (2013.01); *H01L 29/66795* (2013.01)

(58) Field of Classification Search
CPC ......... H01L 21/76846; H01L 21/76895; H01L 21/76897; H01L 23/5226; H01L 23/485; H01L 21/823437; H01L 21/823418; H01L 21/76843; H01L 21/76847; H01L 21/76849; H01L 21/76877; H01L 21/28518; H01L 21/76879; H01L 21/823431; H01L 29/0847; H01L 29/66795; H01L 29/785; H01L 27/0886
See application file for complete search history.

(56) References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 9,893,184 | B2 | 2/2018 | Chang et al. |
| 9,997,632 | B2 | 6/2018 | Chang et al. |
| 10,157,774 | B1* | 12/2018 | Peters ................. H01L 29/7838 |
| 2017/0250268 | A1 | 8/2017 | Hsiao et al. |
| 2018/0261540 | A1* | 9/2018 | Lee ................... H01L 23/53204 |
| 2019/0139825 | A1* | 5/2019 | You ................... H01L 21/31144 |
| 2019/0355663 | A1* | 11/2019 | Nishikawa ........ H01L 23/53266 |
| 2020/0058785 | A1 | 2/2020 | Tsai et al. |
| 2020/0126926 | A1* | 4/2020 | Varghese .......... H01L 21/76847 |
| 2020/0135912 | A1 | 4/2020 | Tsai et al. |
| 2020/0411378 | A1* | 12/2020 | Huang ............. H01L 21/76897 |

* cited by examiner

GATE CONTACT AND VIA STRUCTURES IN SEMICONDUCTOR DEVICES

CROSS-REFERENCE TO RELATED APPLICATIONS

This application claims the benefit of U.S. Provisional Patent Application No. 63/148,198, titled "Bottom-up Contact Plugs for Bottom-up Via Growth to Reduce Contact Resistance," filed Feb. 11, 2021, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

Figure 1A:
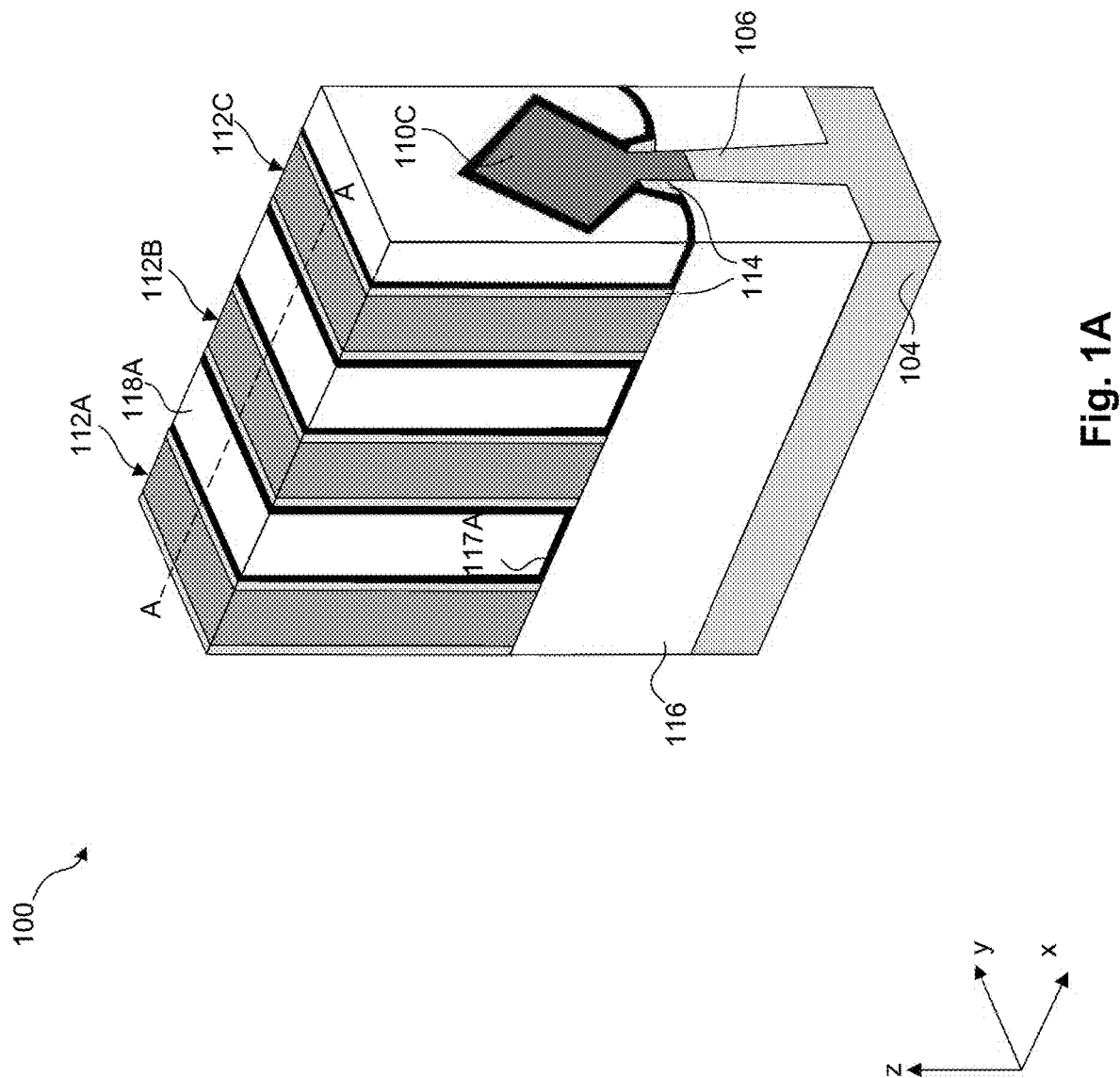
FIGS. 1A and 1F illustrate isometric views of semiconductor devices, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example semiconductor devices (e.g., finFETs, gate-all-around (GAA) FETs, and/or MOSFETs) with gate contact and via structures on gate structures. Further, the present disclosure provides example methods of forming such semiconductor devices with reduced gate contact resistance between the gate structures and the gate contact and via structures. The gate contact and via structures are formed as separate structures in different deposition and/or growth processes in a gate contact opening on the gate structure. The gate contact structure is formed prior to the formation of the gate via structure and acts as a seed layer and/or a growth promoter layer for the growth of the gate via structure. The formation of the gate contact structure prior to the formation of the gate via structure reduces the aspect ratio of the gate contact opening (e.g., the ratio of gate contact opening height to gate contact opening width) in which the gate via structure is formed. The formation of the gate via structure in the gate opening with the reduced aspect ratio substantially reduces or prevents the formation of defects, such as voids and seams within the gate via structures. The presence of such defects can increase the contact resistance between the gate contact and via structures, and consequently increase the gate contact resistance between the gate structure and the gate contact structure. The formation of the gate contact and via structure as separate structures in different deposition and/or growth processes can reduce the gate contact resistance by about 10% to about 50% compared to the formation of gate contact and via structures as a single structure with the same deposition and/or growth process in gate openings of similar dimensions.

In some embodiments, each of the gate structures can include a gate stack with a high-k gate dielectric layer, a work function metal (WFM) layer, and a gate metal fill layer, and a gate capping structure disposed on the gate stack. The gate contact structure is formed within the gate capping structure. In some embodiments, the gate capping structure can include a conductive gate cap disposed on the gate stack and an insulating gate cap disposed on the conductive gate cap. The conductive gate cap improves conductive interface between the gate stack and the gate contact structure to electrically connect the gate stack to the gate contact structure without forming the gate contact structure directly on or within the gate stack. The gate contact structure is not formed directly on or within the gate stack to prevent contamination of the gate stack by any of the processing materials used in the formation of the gate contact structure. Contamination of the gate stack can lead to the degradation of device performance. Thus, with the use of the conductive gate cap, the gate stack can be electrically connected to the gate contact structure without compromising the integrity of the gate structure.

In some embodiments, the insulating gate cap protects the underlying conductive gate cap and the gate stack from structural and/or compositional degradation during subsequent processing of the semiconductor device. In some embodiments, the conductive gate cap controls the depth profile of the gate contact structure and prevents the gate contact structure from extending into the gate stack in addition to providing the conductive interface between the gate stack and the gate contact structure.

FIG. 1A illustrates an isometric view of a FET 100, according to some embodiments. FET 100 can have different cross-sectional views, as illustrated in FIGS. 1B-1E, according to some embodiments. FIGS. 1B-1E illustrate cross-sectional views of FET 100 along line A-A with additional structures that are not shown in FIG. 1A for simplicity. The discussion of elements in FIGS. 1A-1E with the same annotations applies to each other, unless mentioned otherwise. In some embodiments, FET 100 can represent n-type FET 100 (NFET 100) or p-type FET 100 (PFET 100) and the discussion of FET 100 applies to both NFET 100 and PFET 100, unless mentioned otherwise.

Referring to FIG. 1A, FET 100 can include an array of gate structures 112A-112C disposed on a fin structure 106 and an array of S/D regions 110A-110C (S/D region 110C visible in FIG. 1A; 110A-110B visible in FIGS. 1B-1E) disposed on portions of fin structure 106 that are not covered by gate structures 112A-112C. FET 100 can further include gate spacers 114, shallow trench isolation (STI) regions 116, etch stop layers (ESLs) 117A-117B (ESL 117A not shown in FIGS. 1B-1E for simplicity; ESL 117B not shown in FIG. 1A for simplicity, shown in FIG. 1B), and interlayer dielectric (ILD) layers 118A-118B (ILD layer 118B not shown in FIG. 1A for simplicity; shown in FIGS. 1B-1E). ILD layer 118A can be disposed on ESL 117A. In some embodiments, gate spacers 114, STI regions 116, ESLs 117A-117B, and ILD layers 118A-118B can include an insulating material, such as silicon oxide, silicon nitride (SiN), silicon carbon nitride (SiCN), silicon oxycarbon nitride (SiOCN), and silicon germanium oxide. In some embodiments, gate spacers 114 can have a thickness of about 2 nm to about 9 nm for adequate electrical isolation of gate structures 112A-112C from adjacent structures.

FET 100 can be formed on a substrate 104. There may be other FETs and/or structures (e.g., isolation structures) formed on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structure 106 can include a material similar to substrate 104 and extend along an X-axis.

Figure 1B:
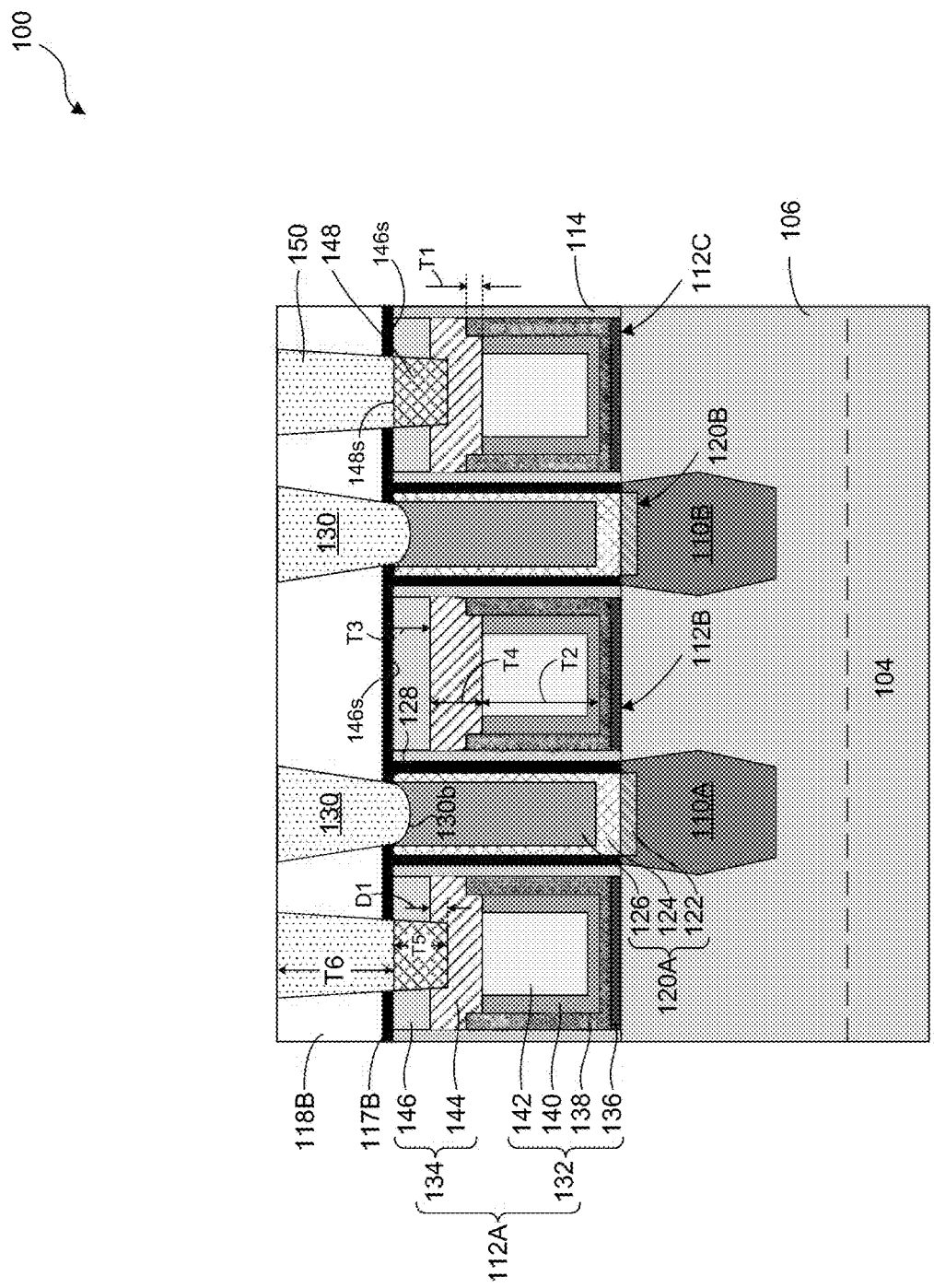
FIGS. 1B-1E and 1G illustrate cross-sectional views of a semiconductor device with gate contact and via structures, in accordance with some embodiments.

Referring to FIG. 1B, FET 100 can include S/D regions 110A-110B, S/D contact structures 120A-120B disposed on respective S/D regions 110A-110B, diffusion barrier layers 128, S/D via structures 130 disposed on S/D contact structures 120A-120B, gate structures 112A-112C disposed on fin structure 106, gate contact structures 148 disposed on gate structures 112A and 112C, and gate via structures 150 disposed on gate contact structures 148. The discussion of gate structures 112A-112C applies to each other, unless mentioned otherwise. In some embodiments, gate structure 112B can be a dummy gate structure and may not be electrically connected to other elements of FET 100.

For NFET 100, each of S/D regions 110A-110B can include an epitaxially-grown semiconductor material, such as Si, and n-type dopants, such as phosphorus and other suitable n-type dopants. For PFET 100, each of S/D regions 110A-110B can include an epitaxially-grown semiconductor material, such as Si and SiGe, and p-type dopants, such as boron and other suitable p-type dopants. In some embodiments, each of S/D contact structures 120A-120B can include (i) a silicide layer 122 disposed within each of S/D regions 110A-110B, (ii) an adhesion layer 124 disposed on silicide layer 122, and (iii) a contact plug 126 disposed on adhesion layer 124.

In some embodiments, for NFET 100, silicide layers 122 can include a metal or a metal silicide with a work function value closer to a conduction band-edge energy than a valence band-edge energy of the material of S/D regions 110A-110B. For example, the metal or the metal silicide can have a work function value less than 4.5 eV (e.g., about 3.5 eV to about 4.4 eV), which can be closer to the conduction band energy (e.g., 4.1 eV for Si) than the valence band energy (e.g., 5.2 eV for Si) of Si-based material of S/D regions 110A-110B. In some embodiments, for NFET 100, the metal silicide of silicide layers 122 can include titanium silicide (Ti$_x$Si$_y$), tantalum silicide (Ta$_x$Si$_y$), molybdenum silicide (MoxSiy), zirconium silicide (ZrxSiy), hafnium silicide (HfxSiy), scandium silicide (ScxSiy), yttrium silicide (YxSiy), terbium silicide (TbxSiy), lutetium silicide (LuxSiy), erbium silicide (ErxSiy), ybtterbium silicide (YbxSiy), europium silicide (EuxSiy), thorium silicide (ThxSiy), other suitable metal silicide materials, or a combination thereof.

In some embodiments, for PFET 100, silicide layers 122 can include a metal or a metal silicide with a work function value closer to a valence band-edge energy than a conduction band-edge energy of the material of S/D regions 110A-110B. For example, the metal or the metal silicide can have a work function value greater than 4.5 eV (e.g., about 4.5 eV to about 5.5 eV), which can be closer to the valence band energy (e.g., about 5.2 eV for Si) than the conduction band energy (e.g., 4.1 eV for Si) of Si-based material of S/D regions 110A-110B. In some embodiments, for PFET 100, the metal silicide of silicide layers 122 can include nickel silicide ($Ni_xSi_y$), cobalt silicide ($Co_xSi_y$), manganese silicide ($Mn_xSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), other suitable metal silicide materials, or a combination thereof.

Adhesion layers 124 (also referred to as "liners" or "glue layers") can promote adhesion between the materials of contact plugs 126 and diffusion barrier layers 128, and as a result aid in the formation of contact plugs 126 without voids. In some embodiments, adhesion layers 124 can include a metal nitride, such as titanium nitride (TiN), tantalum nitride (TaN), and other suitable metal nitride materials. In some embodiments, each of adhesion layers 124 can include a single layer of metal nitride or can include a stack of metal layer, and the metal nitride layer. The metal layer can be disposed on silicide layer 122, and the metal nitride layer can be disposed on the metal layer. In some embodiments, the metal layer can include Ti, Ta, or other suitable metals and can include the same metal as the metal nitride layer.

Contact plugs 126 can include conductive materials with low resistivity (e.g., resistivity of about 50 μΩ-cm, about 40 μΩ-cm, about 30 μΩ-cm, about 20 μΩ-cm, or about 10 μΩ-cm), such as cobalt (Co), tungsten (W), ruthenium (Ru), iridium (Ir), nickel (Ni), Osmium (Os), rhodium (Rh), aluminum (Al), molybdenum (Mo), other suitable conductive materials with low resistivity, and a combination thereof. Diffusion barrier layers 128 can prevent the oxidation of contact plugs 126 by preventing the diffusion of oxygen atoms from adjacent structures to contact plugs 126. In some embodiments, diffusion barrier layers 128 can include a dielectric nitride, such as silicon nitride ($Si_xN_y$), silicon oxynitride (SiON), silicon carbon nitride (SiCN), and other suitable dielectric nitride materials.

Figure 1C:
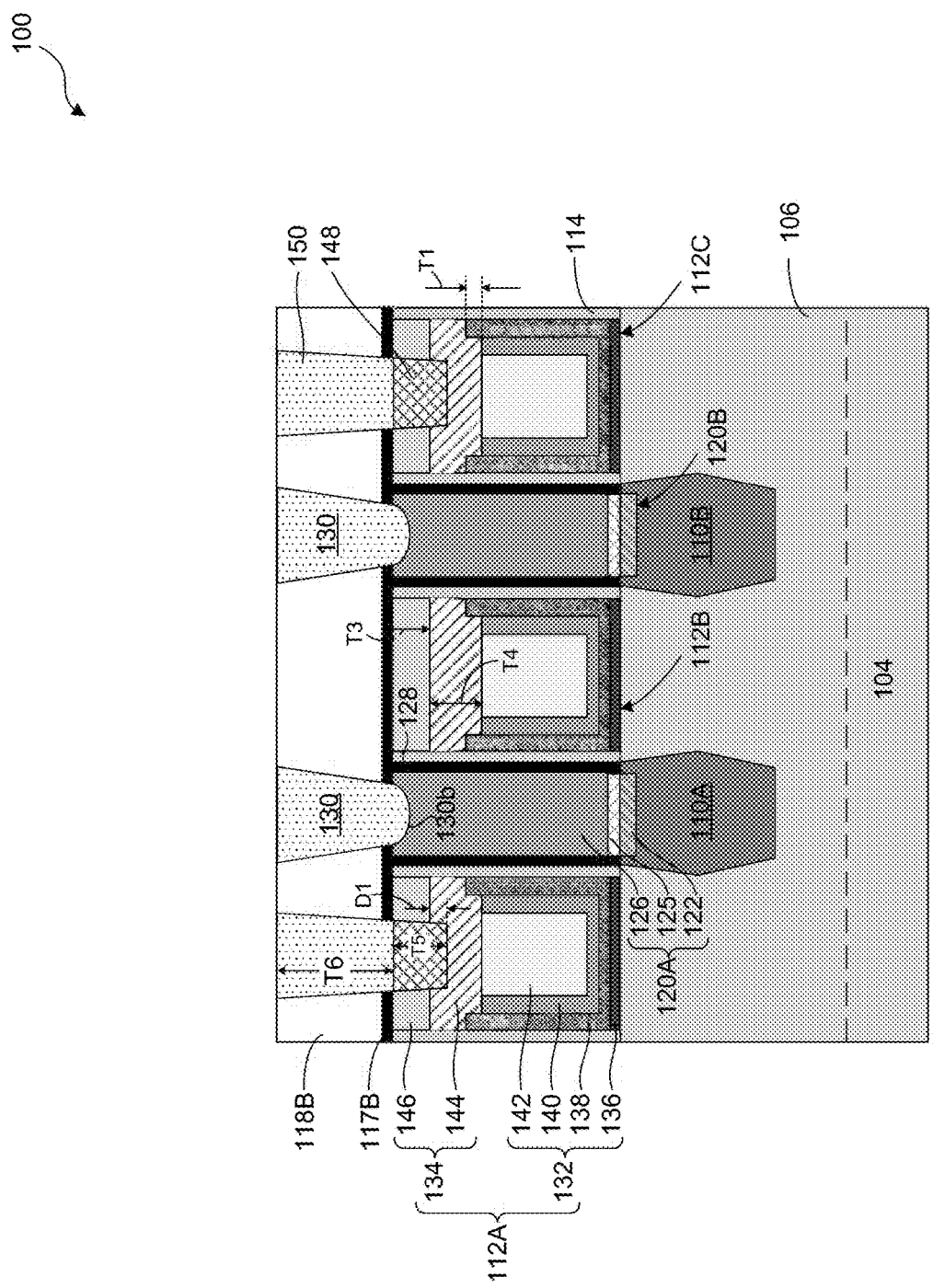

In some embodiments, S/D contact structures 120A-120B can include adhesion layers 125, instead of adhesion layers 124, as shown in FIG. 1C. Adhesion layers 125 can be used when contact plugs 126 include metals, such as W, Ru, Ir, and Mo that may not need a layer to promote adhesion with the material of diffusion barrier layers 128. In some embodiments, adhesion layers 125 serve as seed layers and/or growth layers for the deposition or bottom-up growth of contact plugs 126. In some embodiments, adhesion layers 125 can act as an oxidation barrier layer to prevent the oxidation of silicide layers 122. In some embodiments, adhesion layers 125 can include a metal nitride, such as TiN, TaN, and other suitable metal nitride materials. In some embodiments, each of adhesion layers 125 can include a single layer of metal nitride or can include a stack of metal layer and metal nitride layer. The metal layer can be disposed on silicide layer 122, and the metal nitride layer can be disposed on the metal layer. In some embodiments, the metal layer can include Ti, Ta, or other suitable metals and can include the same metal as the metal nitride layer.

Figure 1D:
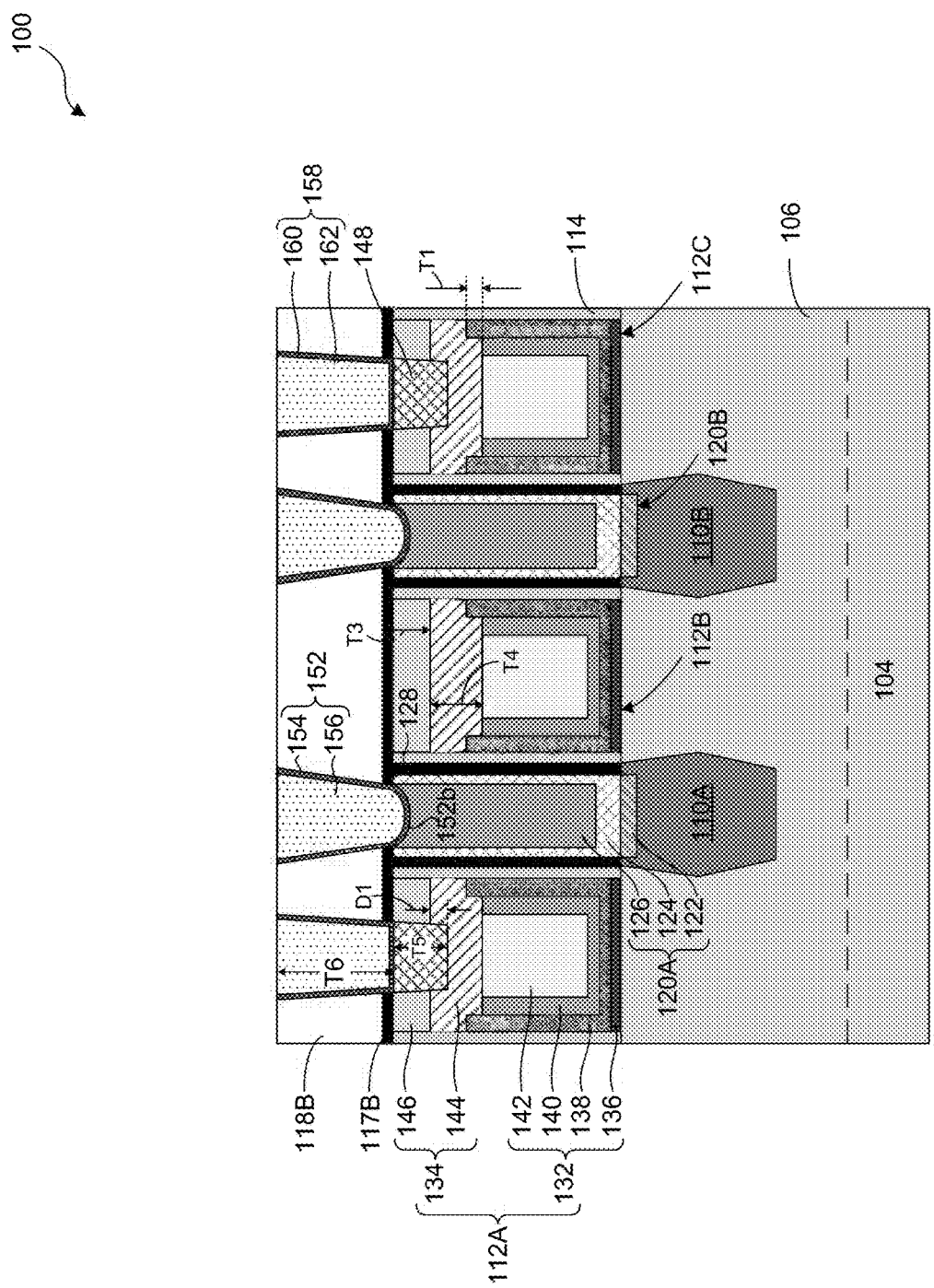

S/D contact structures 120A-120B can electrically connect to overlying interconnect structures (not shown), power supplies (not shown), and/or other elements of FET 100 through S/D via structures 130. S/D via structures 130 can be disposed on S/D contact structures 120A-120B and can include conductive materials, such as Ru, Co, Ni, Al, Mo, W, Ir, Os, Cu, and Pt. In some embodiments, the conductive materials of S/D via structures 130 are formed by a bottom-up approach, which is described in detail below, and as a result, S/D via structures 130 are formed without adhesion layers (also referred to as "liners" or "glue layers") along the sidewalls of S/D via structures 130. In some embodiments, FET 100 can have S/D via structures 152, instead of S/D via structures 130, as shown in FIG. 1D. In some embodiments, S/D via structures 152 can include adhesion layers 154 and via plugs 156. Adhesion layers 154 can promote adhesion between the materials of via plugs 156 and ILD layer 118B. In some embodiments, adhesion layers 154 can include a metal nitride, such as titanium nitride (TiN), tantalum nitride (TaN), and other suitable metal nitride materials. In some embodiments, via plugs 156 can include conductive materials, such as Co, Ni, Al, Mo, W, Ir, Os, Cu, and Pt.

In some embodiments, S/D via structures 130 and 152 can be formed using a precursor gas of tungsten hexafluoride ($WF_6$), and as a result, S/D via structures 130 and 152 can include tungsten with impurities of fluorine atoms. The concentration of fluorine atom impurities in each S/D via structures 130 and 152 can range from about 1 atomic percent to about 10 atomic percent of the total concentration of atoms in each S/D via structures 130 and 152. In some embodiments, bottom surfaces 130b and 152b of respective S/D via structures 130 and 152 can have curved profiles to increase the contact area between contact plugs 126 and S/D via structures 130 and 152, and consequently decrease the contact resistance between contact plugs 126 and S/D via structures 130 and 152. In some embodiments, S/D via structures 130 and 152 can have diameters (or widths) along an X-axis ranging from about 10 nm to about 20 nm to provide an optimal contact area between S/D contact structures 120A-120B and overlying interconnect structures (not shown) without compromising device size and manufacturing cost. In some embodiments, S/D via structures 130 can have a height along a Z-axis ranging from about 20 nm to about 30 nm and contact plugs 126 can have a height along a Z-axis ranging from about 20 nm to about 30 nm. In some embodiments, a ratio between the heights (along a Z-axis) of S/D via structures 130 and contact plugs 126 can range from about 1:1 to about 1:1.5 without compromising comprising the contact resistance between S/D contact structures 120A-120B and S/D regions 110A-110B and the device size.

Referring to FIG. 1B, each of gate structures 112A-112C can include a gate stack 132 disposed on fin structure 106 and a gate capping structure 134 disposed on gate stack 132. Gate stack 132 can include (i) an interfacial oxide (IO) layer 136 disposed on fin structure 106, (ii) a high-k (HK) gate dielectric layer 138 disposed on IO layer 136, (iii) a WFM layer 140 disposed on HK gate dielectric layer 138, and (iv) a gate metal fill layer 142 disposed on WFM layer 140.

In some embodiments, IO layer 136 can include Sift, silicon germanium oxide ($SiGeO_x$), germanium oxide ($GeO_x$), or other suitable oxide materials. In some embodiments, HK gate dielectric layer 138 can include (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) a combination thereof, or (iv) other suitable high-k dielectric materials. As used herein, the term "high-k" refers to a high dielectric constant. In the field of semiconductor device structures and manufacturing processes, high-k refers to a dielectric constant that is greater than the dielectric constant of $SiO_2$ (e.g., greater than about 3.9).

For NFET 100, WFM layer 140 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based conductive materials, or a combination thereof. For PFET 100, WFM layer 140 can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), other suitable substantially Al-free conductive materials, or a combination thereof.

In some embodiments, gate metal fill layer 142 can include a suitable conductive material, such as tungsten (W), titanium (Ti), silver (Ag), ruthenium (Ru), molybdenum (Mo), copper (Cu), cobalt (Co), aluminum (Al), iridium (Ir), nickel (Ni), other suitable conductive materials, or a combination thereof. In some embodiments, gate metal fill layer 142 can include a substantially fluorine-free metal layer (e.g., fluorine-free W). The substantially fluorine-free metal layer can include an amount of fluorine contaminants less than about 5 atomic percent in the form of ions, atoms, and/or molecules. The stack of gate metal fill layer 142 and WFM layer 140 (or the stack of all conductive gate layers on HK gate dielectric layer 138) can be referred to as the conductive stack of gate stack 132. In some embodiments, a thickness T2 of the conductive stack can range from about 10 nm to about 15 nm for adequate gate performance without compromising the device size and manufacturing cost.

In some embodiments, HK gate dielectric layer 138 extends above the top surfaces of WFM layer 140 and gate metal fill layer 142 by a thickness T1 ranging from about 1 nm to about 5 nm. The planarity of the top surface of HK gate dielectric layer 138 with respect to the top surfaces of WFM layer 140 and gate metal fill layer 142 depends on the relative etching rates of the materials of HK gate dielectric layer 138, WFM layer 140, and gate metal fill layer 142 during the fabrication of gate stack 132, which is described in detail below.

In some embodiments, each of gate capping structures 134 can include a conductive gate cap 144 disposed on gate stack 132 and an insulating gate cap 146 disposed on conductive gate cap 144. Insulating gate cap 146 protects the underlying conductive gate cap 144 and gate stack 132 from structural and/or compositional degradation during subsequent processing of the semiconductor device. In some embodiments, insulating gate cap 146 can include a nitride material, such as silicon nitride, and can have a thickness T3 ranging from about 5 nm to about 10 nm for adequate protection of the underlying conductive gate cap 144 and gate stack 132.

Conductive gate cap 144 provides a conductive interface between gate stack 132 and gate contact structure 148 to electrically connect gate stack 132 to gate contact structure 148 without forming gate contact structure 148 directly on or within gate stack 132. Gate contact structure 148 is not formed directly on or within gate stack 132 to prevent contamination of gate stack 132 by any of the processing materials used in the formation of gate contact structure 148, which is described in detail below. Contamination of gate stack 132 can lead to the degradation of device performance. Thus, with the use of conductive gate cap 144, gate stack 132 can be electrically connected to gate contact structure 148 without compromising the integrity of gate structures 112A-112C.

In some embodiments, conductive gate cap 144 can include a metallic material, such as W, Ru, Ir, Mo, other suitable metallic materials, and a combination thereof. In some embodiments, conductive gate cap 144 can be formed using a precursor gas of tungsten pentachloride ($WCl_5$) or tungsten hexachloride ($WCl_6$), and as a result, conductive gate cap 144 can include tungsten with impurities of chlorine atoms. The concentration of chlorine atom impurities can range from about 1 atomic percent to about 10 atomic percent of the total concentration of atoms in each conductive gate cap 144.

In some embodiments, conductive gate cap 144 can control the depth profile of gate contact structure 148 and prevent gate contact structure 148 from extending into gate stack 132 in addition to providing the conductive interface between gate stack 132 and gate contact structure 148. In some embodiments, conductive gate cap 144 can have a thickness T4 ranging from about 4 nm to about 5 nm and gate contact structure 148 can extend a distance D1 ranging from about 1 nm to about 4 nm into conductive gate cap 144 for adequately controlling the depth profile of gate contact structure 148. To prevent gate contact structure 148 from extending into gate stack 132, conductive gate cap 144 is formed with thickness T4 greater than D1. In some embodiments, for adequate conductive interface between gate stack 132 and gate contact structure 148, a ratio (T4:T2) between thickness T4 of conductive gate cap 144 and thickness T2 of the conductive stack can range from about 1:2 to about 1:4. In some embodiments, for adequate protection of the underlying conductive gate cap 144, a ratio (T4:T3) between thickness T4 of conductive gate cap 144 and thickness T3 of insulating gate cap 146 can range from about 1:1 to about 1:2.

In some embodiments, gate contact structures 148 can include a metallic material, such as W, Ir, Mo, other suitable metallic materials, and a combination thereof. In some embodiments, gate via structures 150 can include a metallic material, such as Ru, W, Ir, Mo, other suitable metallic materials, and a combination thereof. The materials of gate contact structures 148 and gate via structures 150 can be different from each other. In some embodiments, gate via structures 150 and S/D via structures 130 can have the same materials.

In some embodiments, gate contact structures 148 act as seed layers and/or growth promoter layers for the bottom-up deposition of gate via structures 150. In some embodiments, gate contact structures 148 controls the aspect ratio of gate contact openings 2276 (shown in FIG. 22) in which gate via structures 150 are formed, which is described in detail below. The aspect ratio of gate contact openings 2276 is controlled to reduce or prevent the formation of defects, such as voids and seams within gate via structures 150. The presence of such defects can increase the contact resistance between gate contact structures 148 and gate via structures 150, and consequently increase the gate contact resistance between gate contact structures 148 and gate structures 112A and 112C.

In some embodiments, for adequately controlling the aspect ratio of gate contact openings 2276, top surfaces 148s of gate contact structures 148 can be substantially coplanar with top surfaces 146s of insulating gate caps 146. In some embodiments, for adequately controlling the aspect ratio of gate contact openings 2276, thickness T5 of gate contact structures 148 can range from about 5 nm to about 10 nm. In some embodiments, for adequately controlling the aspect ratio of gate contact openings 2276, a ratio (T5:T6) between thickness T5 and thickness T6 of gate via structures 150 can range from about 1:2 to about 1:6. In some embodiments, thickness T6 can range from about 20 nm to about 30 nm.

In some embodiments, the conductive materials of gate via structures 150 are formed by a bottom-up approach, which is described in detail below, and as a result, gate via structures 150 are formed without adhesion layers along the sidewalls of gate via structures 150. In some embodiments, FET 100 can have gate via structures 158, instead of gate via structures 150, as shown in FIG. 1D. In some embodiments, gate via structures 158 can include adhesion layers 160 and via plugs 162. Adhesion layers 160 can promote adhesion between the materials of via plugs 162 and ILD layer 118B. In some embodiments, adhesion layers 160 can include a metal nitride, such as titanium nitride (TiN), tantalum nitride (TaN), and other suitable metal nitride materials. In some embodiments, via plugs 162 can include conductive materials, such as Co, Ni, Al, Mo, W, Ir, Os, Cu, and Pt. In some embodiments, gate via structures 158 can be similar to S/D via structures 152.

Figure 1E:
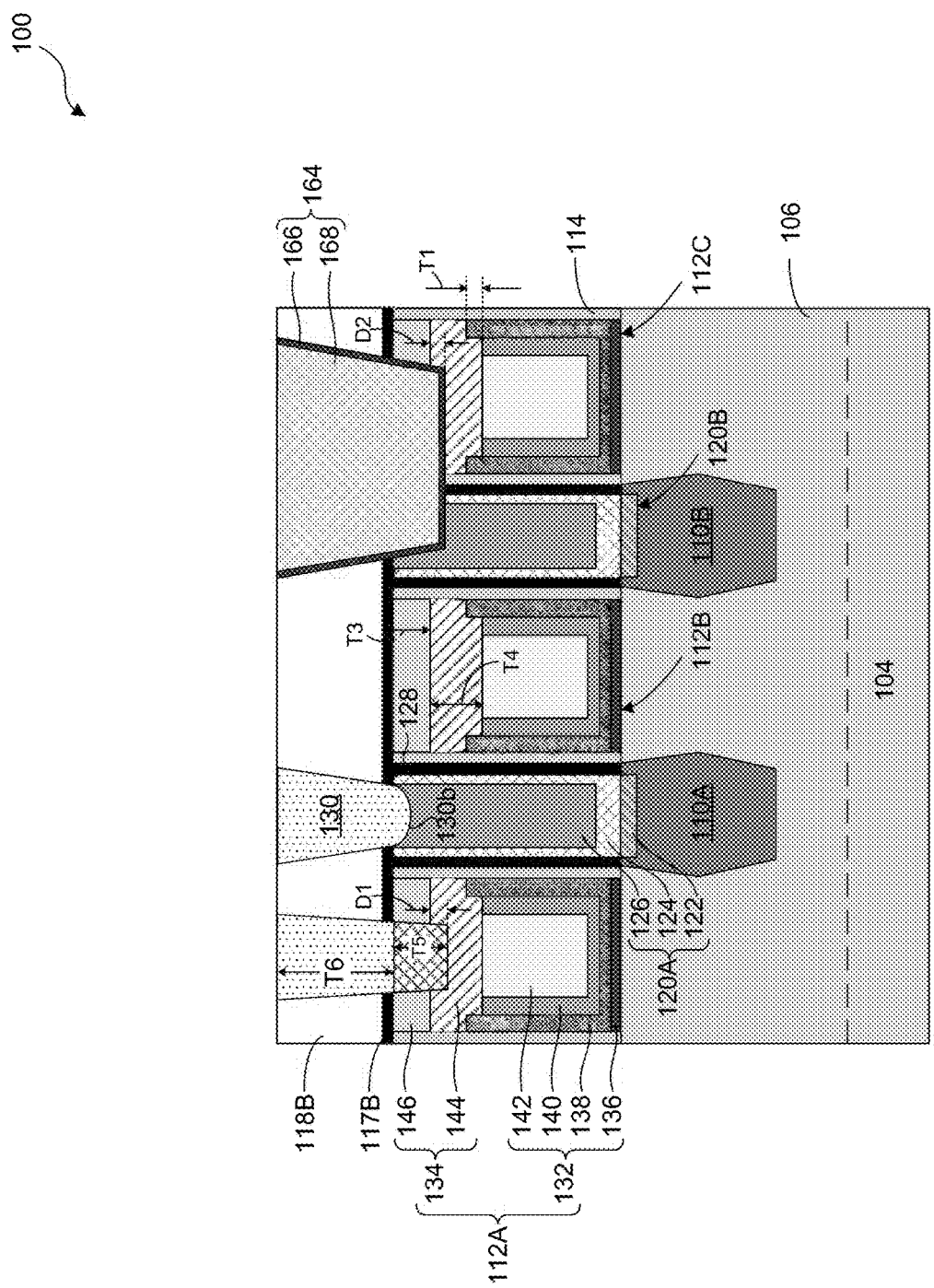

In some embodiments, instead of S/D via structure 130 on S/D contact structure 120B and gate contact structure 148 and gate via structure 150 on gate structure 112C, a merged via-contact structure 164 can be disposed over S/D region 110B and gate structure 112C, as shown in FIG. 1E. Merged via-contact structure 164 electrically connects S/D region 110B and gate structure 112C with each other and with overlying interconnect structures (not shown) when FET 100 is formed in a logic device area and/or in a static random access memory (SRAM) device area of an integrated circuit (not shown). Merged via-contact structure 164 can include an adhesion layer 166 and a contact plug 168 disposed on adhesion layer 166. In some embodiments, adhesion layer 166 and contact plug 168 can include material similar to adhesion layer 154 and via plug 156, respectively.

Figure 1F:
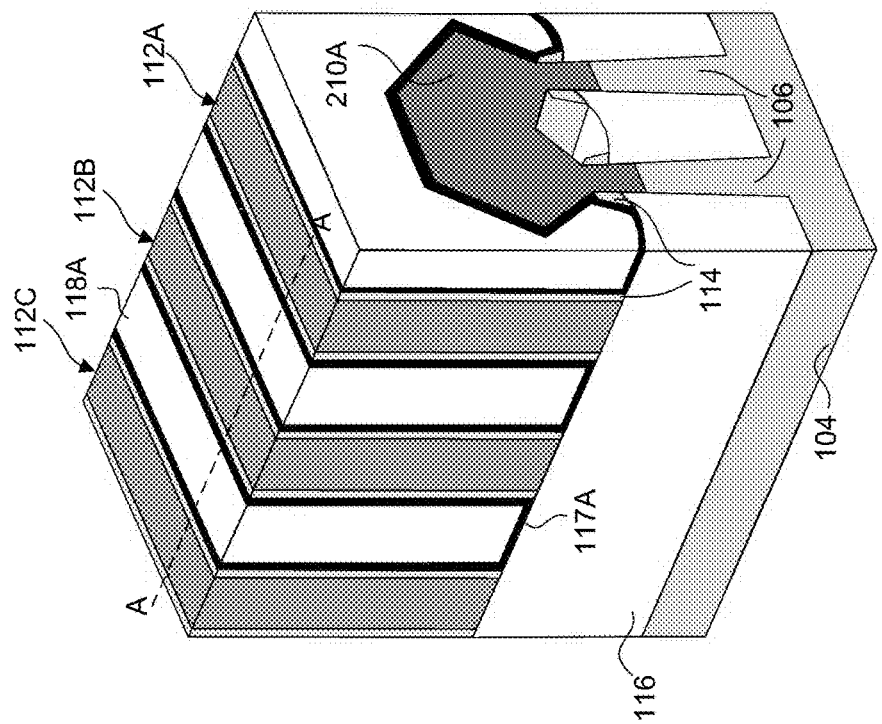

FIG. 1F illustrates another isometric view of FET 100, according to some embodiments. In some embodiments, FET 100 can have merged S/D regions 210A-210C (merged S/D region 210A visible in FIG. 1F; merged S/D regions 210B-210C underlying ILD layer 118A) instead of source/drain regions 110A-110C. The discussion of S/D regions 110A-110C applies to merged S/D regions 210A-210C, unless mentioned otherwise. FET 100 of FIG. 1D can have cross-sectional views along line A-A similar to the cross-sectional views of FIGS. 1B-1E. The discussion of elements in FIGS. 1A-1E with the same annotations applies to each other, unless mentioned otherwise.

Figure 1G:
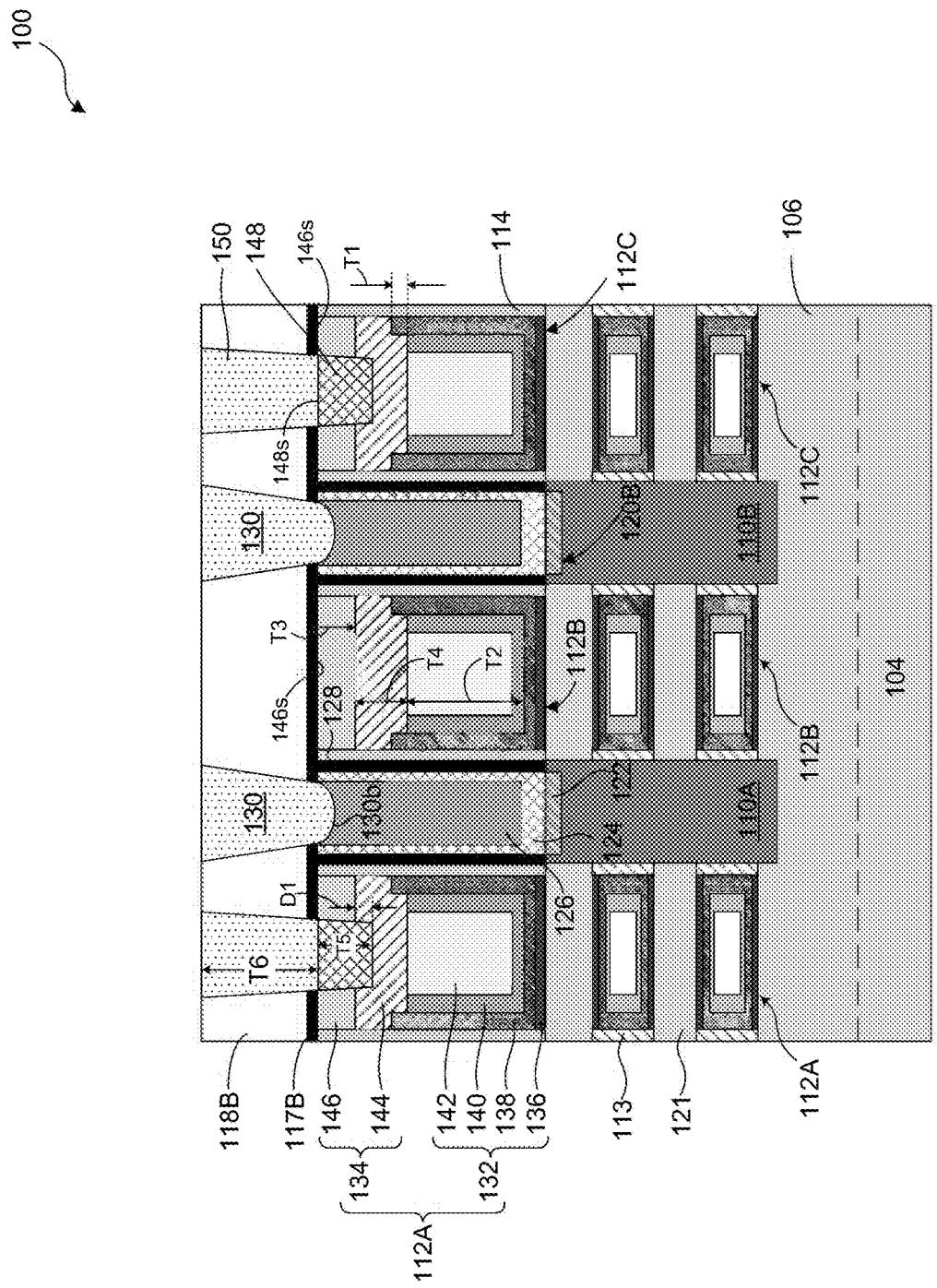

Referring to FIG. 1G, in some embodiments, FET 100 can be a GAA FET 100 instead of finFET 100 shown in FIGS. 1B-1E. For GAA FET 100, gate structures 112A-112C can have cross-sectional views as shown in FIG. 1G, instead of the cross-sectional views shown in FIGS. 1B-1E. Gate structures 112A-112C of GAA FET 100 can be wrapped around nanostructured channel regions 121. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm are within the scope of the disclosure.

Nanostructured channel regions 121 can include semiconductor materials similar to or different from substrate 104. In some embodiments, nanostructured channel regions 121 can include Si, SiAs, silicon phosphide (SiP), SiC, SiCP, SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 121 are shown, nanostructured channel regions 121 can have cross-sections of other geometric shapes (e.g., circular, elliptical, triangular, or polygonal). Gate portions of gate structures 112A-112C surrounding nanostructured channel regions 121 can be electrically isolated from adjacent S/D regions 110A-110B by inner spacers 113. Inner spacers 113 can include an insulating material, such as $SiO_x$, SiN, SiCN, SiOCN, and other suitable insulating materials.

Figure 2:
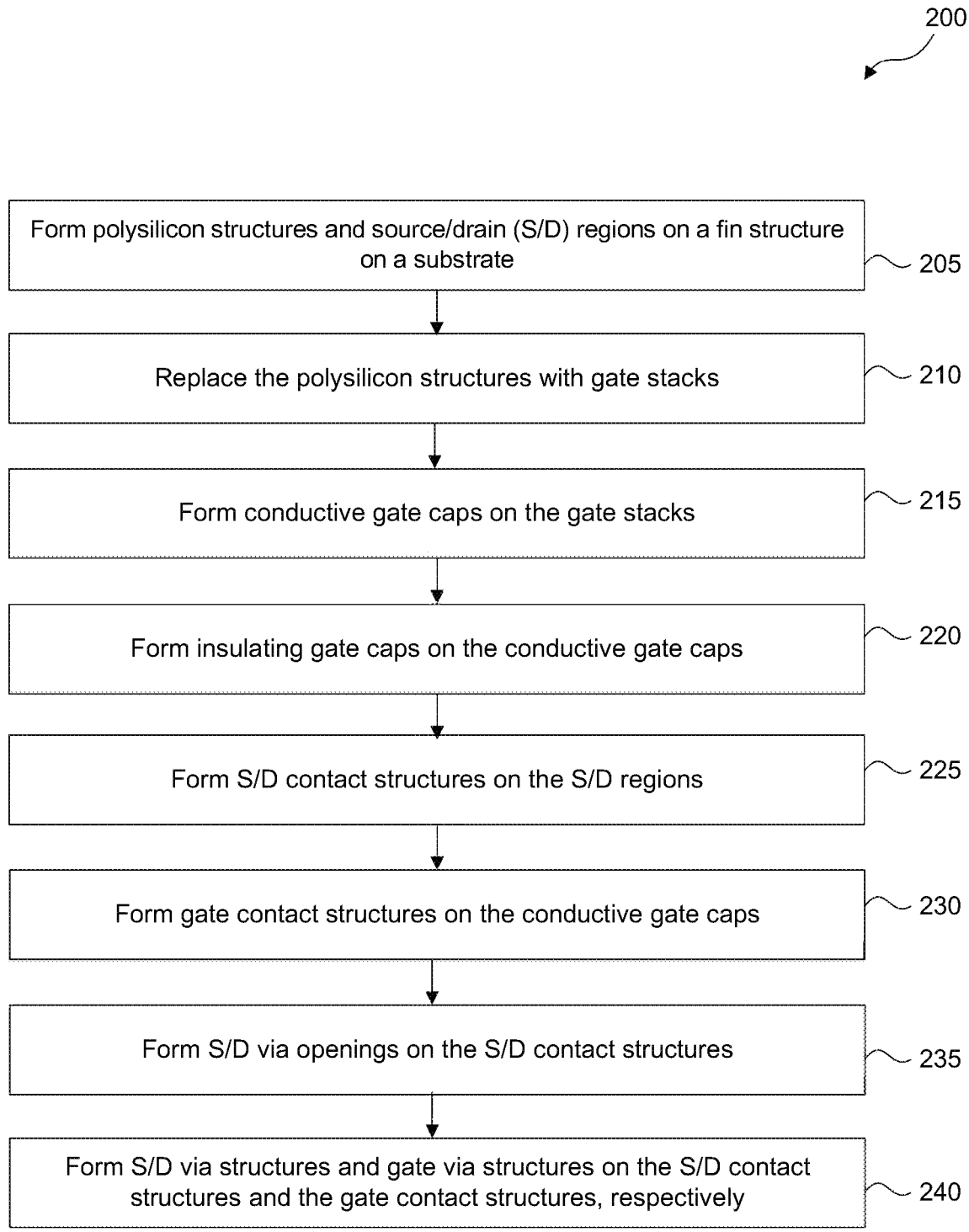
FIG. 2 is a flow diagram of a method for fabricating a semiconductor device with gate contact and via structures, in accordance with some embodiments.

FIG. 2 is a flow diagram of an example method 200 for fabricating FET 100 with cross-sectional view shown in FIG. 1B, according to some embodiments. For illustrative purposes, the operations illustrated in FIG. 2 will be described with reference to the example fabrication process for fabricating FET 100 as illustrated in FIGS. 3-33. FIGS. 3-33 are cross-sectional views of FET 100 along line A-A of FIG. 1A at various stages of fabrication, according to some embodiments. Operations can be performed in a different order or not performed depending on specific applications. It should be noted that method 200 may not produce a complete FET 100. Accordingly, it is understood that additional processes can be provided before, during, and after method 200, and that some other processes may only be briefly described herein. Elements in FIGS. 3-33 with the same annotations as elements in FIGS. 1A-1E are described above.

Figure 3:
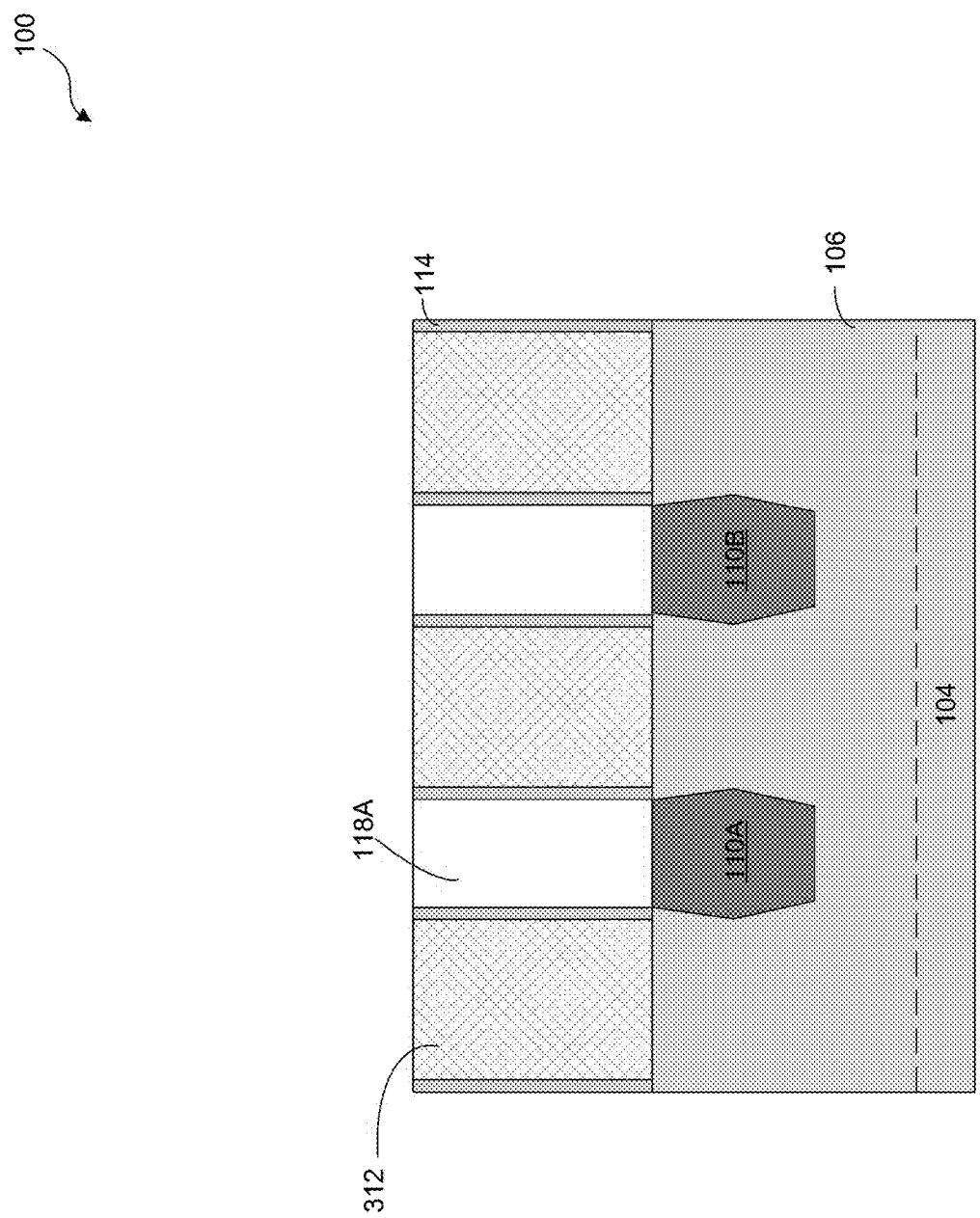
FIGS. 3-33 illustrate cross-sectional views of a semiconductor device with gate contact and via structures at various stages of its fabrication process, in accordance with some embodiments.

In operation 205, polysilicon structures and S/D regions are formed on a fin structure on a substrate. For example, as shown in FIG. 3, polysilicon structures 312 and S/D regions 110A-110B are formed on fin structure 106, which is formed on substrate 104. During subsequent processing, polysilicon structures 312 can be replaced in a gate replacement process to form gate structures 112A-112C. After the formation of S/D regions 110A-110C, ESL 117A (shown in FIG. 1A; not shown in FIGS. 3-33 for simplicity) and ILD layer 118A can be formed to form the structure of FIG. 3.

Figure 4:
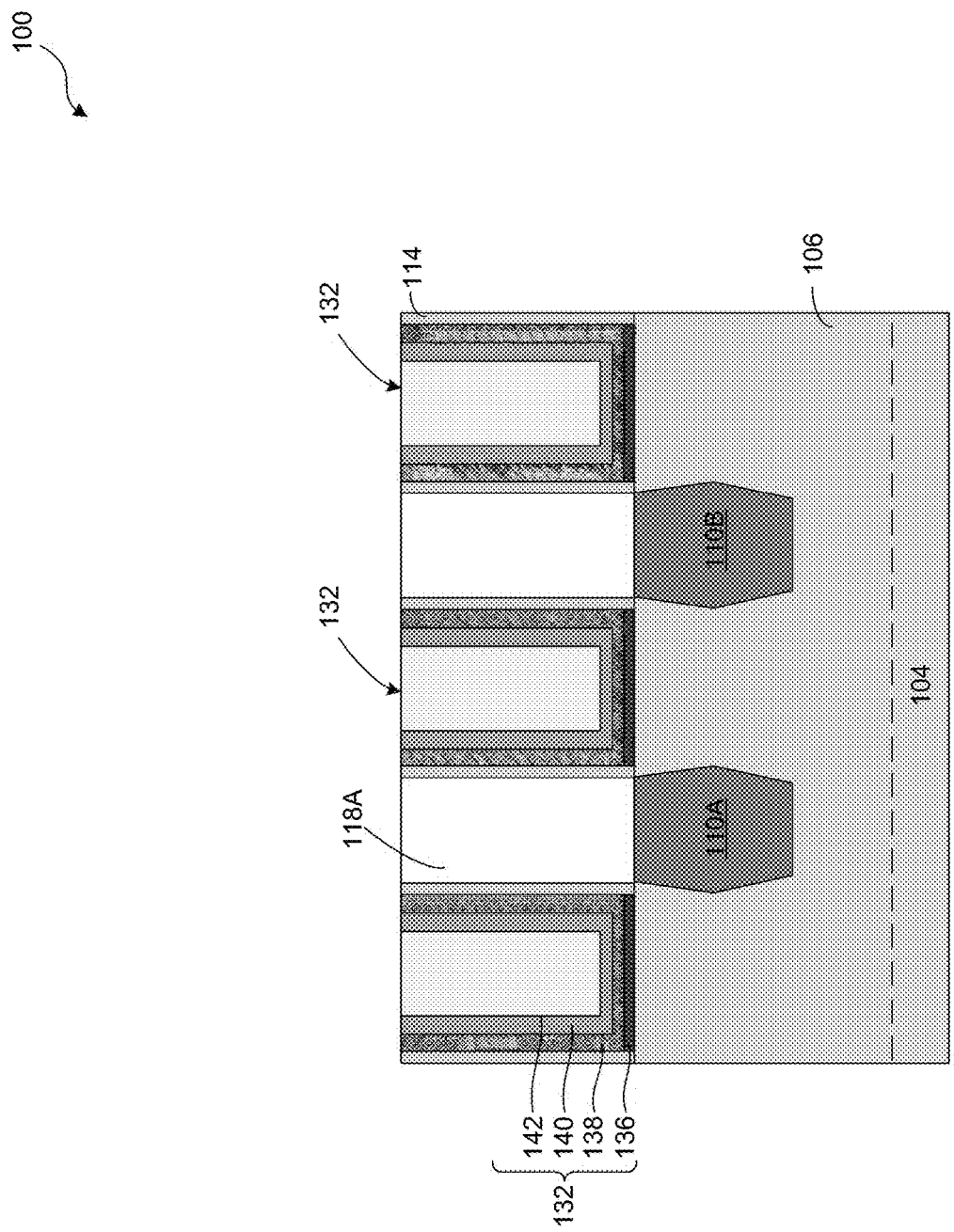
Figure 5:
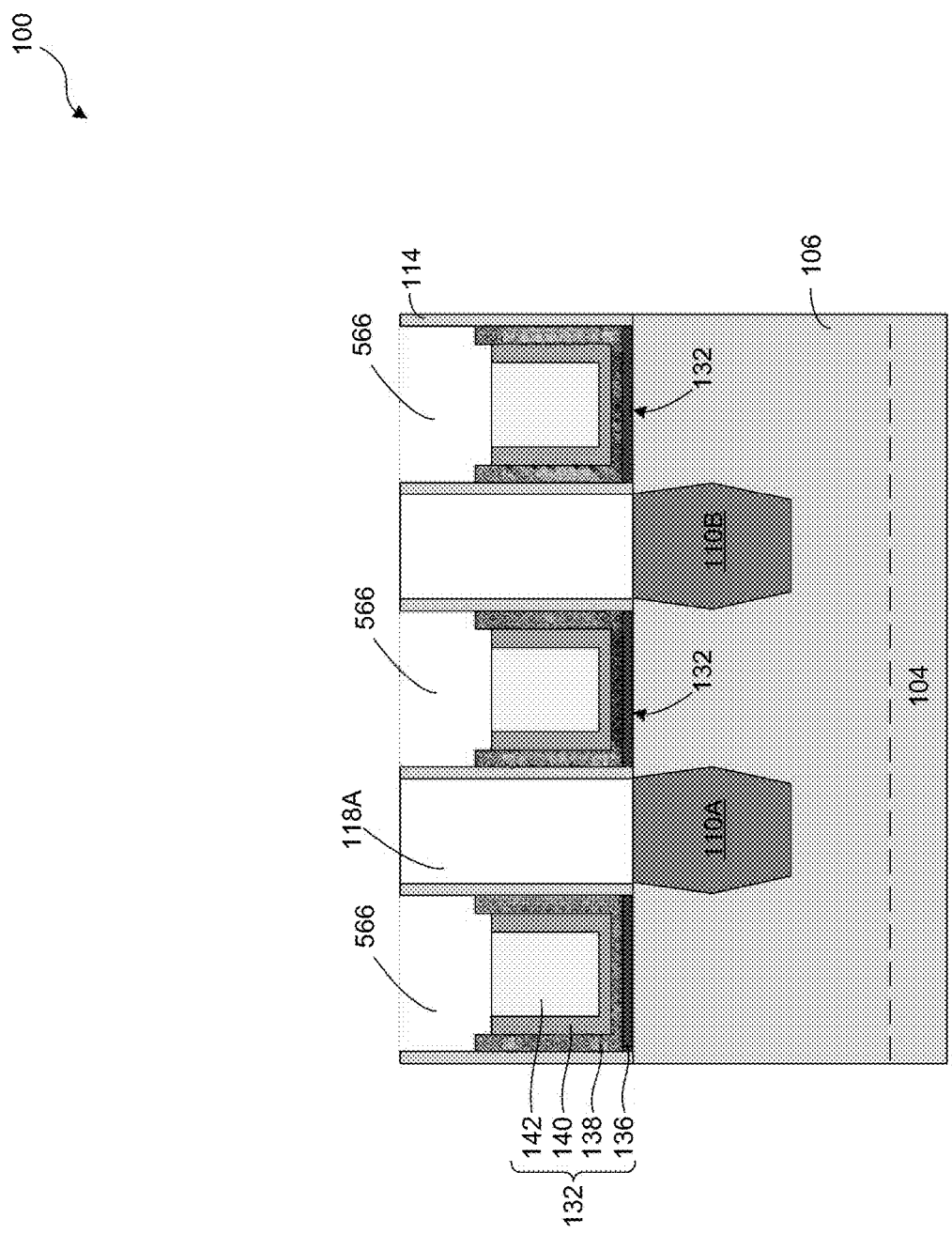
Figure 6:
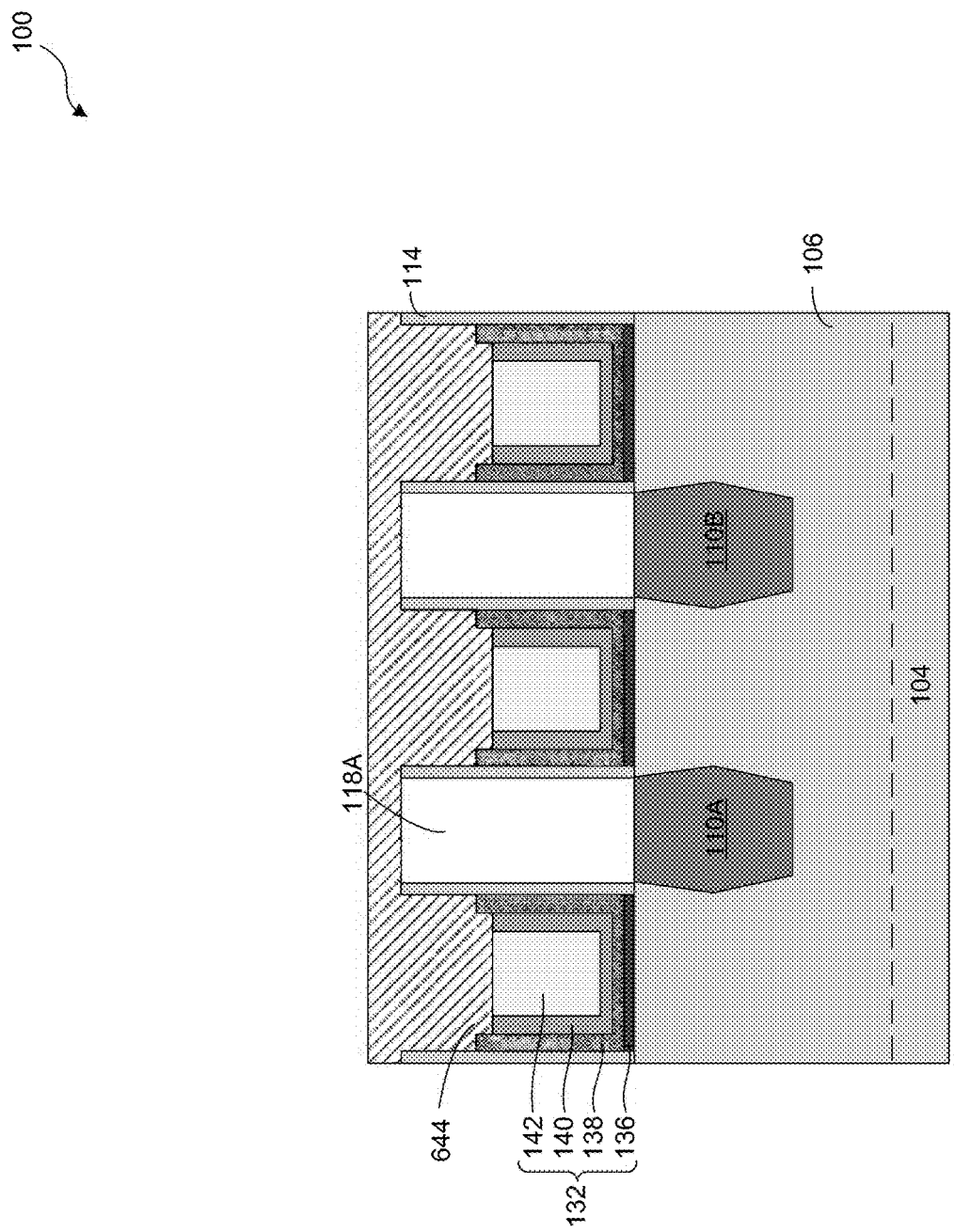

Referring to FIG. 2, in operation 210, polysilicon structures are replaced with gate stacks. For example, as described with reference to FIGS. 4-5, polysilicon structures 312 are replaced with gate stacks 132. The formation of gate stacks 132 can include sequential operations of (i) replacing polysilicon structures 312 with the layers—IO layers 136, HK gate dielectric layers 138, WFM layers 140, and gate metal fill layers 142—of gate stacks 132, as shown in FIG. 4, and (ii) etching the layers of gate stacks 132 to form gate cap openings 566, as shown in FIG. 5.

Figure 7:
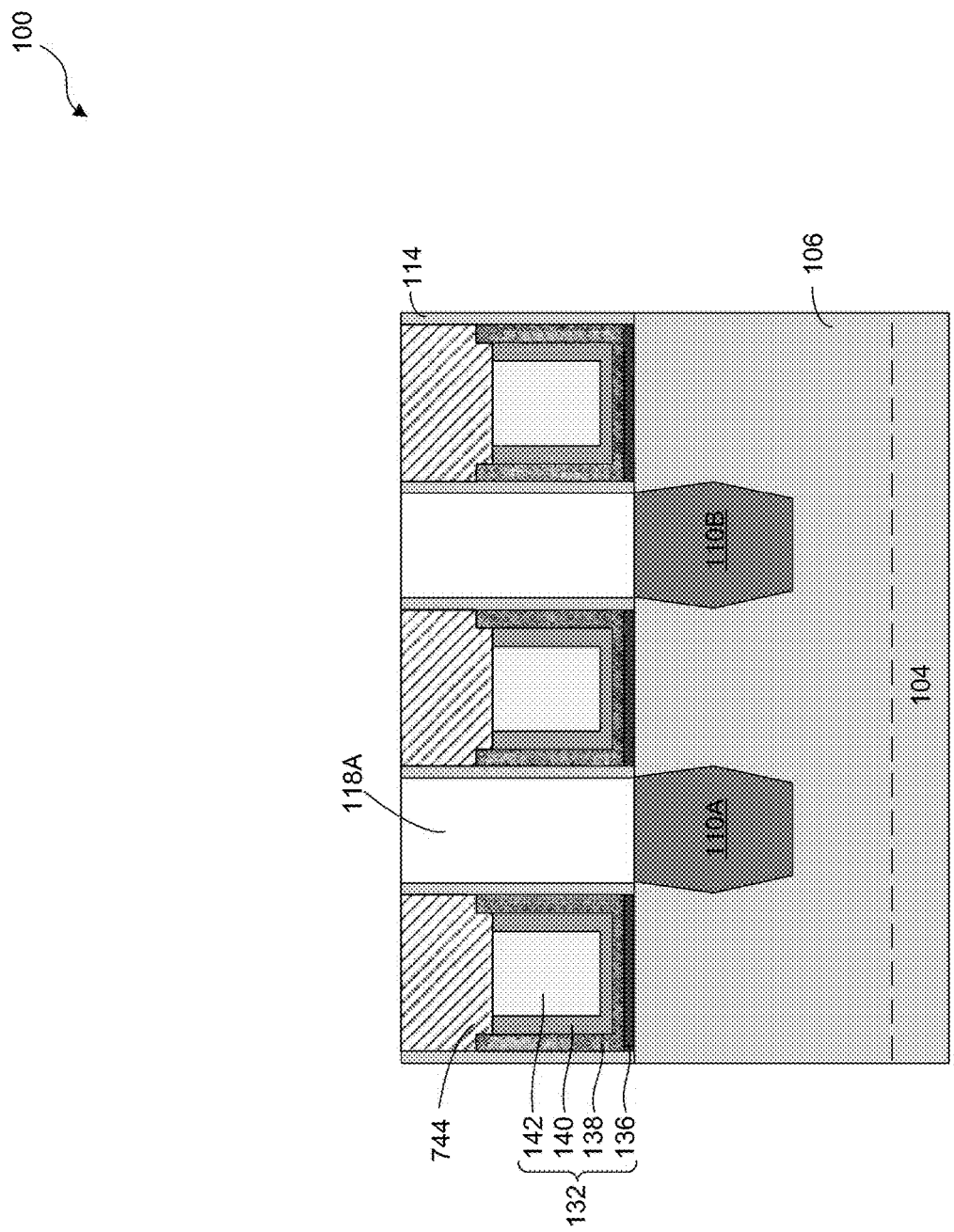
Figure 8:
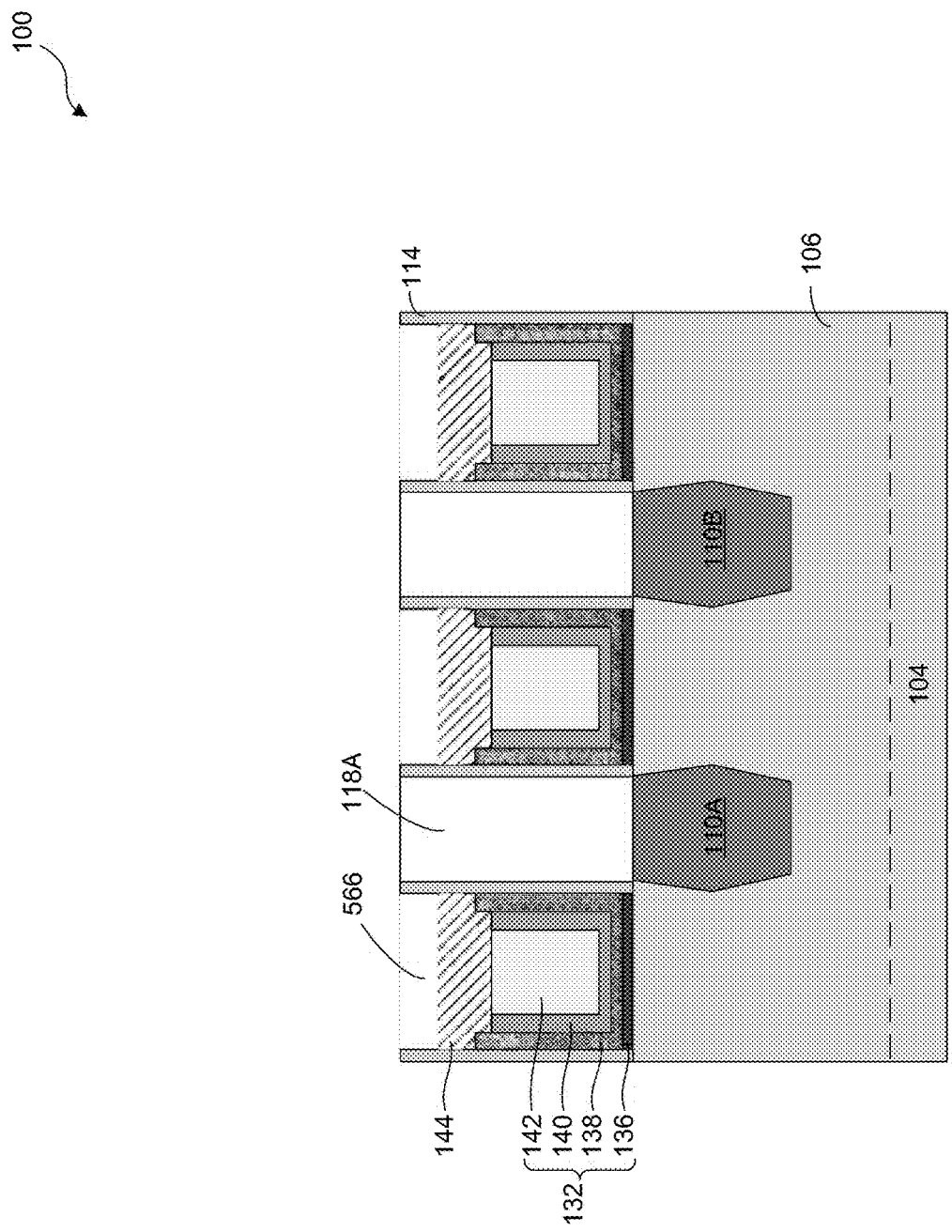

Referring to FIG. 2, in operation 215, conductive gate caps are formed on the gate stacks. For example, as described with reference to FIGS. 6-8, conductive gate caps 144 are formed on gate stacks 132. The formation of conductive gate caps 144 can include sequential operations of (i) depositing a conductive layer 644 on the structure of FIG. 5 to form the structure of FIG. 6, (ii) performing a chemical mechanical polish (CMP) process on conductive layer 644 to form conductive layers 644, as shown in FIG. 7, and (iii) etching conductive layer 644 using a dry or wet etch process to form conductive gate caps 144, as shown in FIG. 8. In some embodiments, depositing conductive layer 644 can include depositing a fluorine-free W layer with a WC15 precursor gas at a temperature ranging from about 300° C. to about 550° C. and at a pressure ranging from about 15 torr to about 40 torr. Other thicknesses, temperatures, and pressure ranges are within the scope of the disclosure. The use of fluorine-free W for conductive layer 644 prevent degradation of underlying gate stacks 132 from fluorine contamination.

Figure 9:
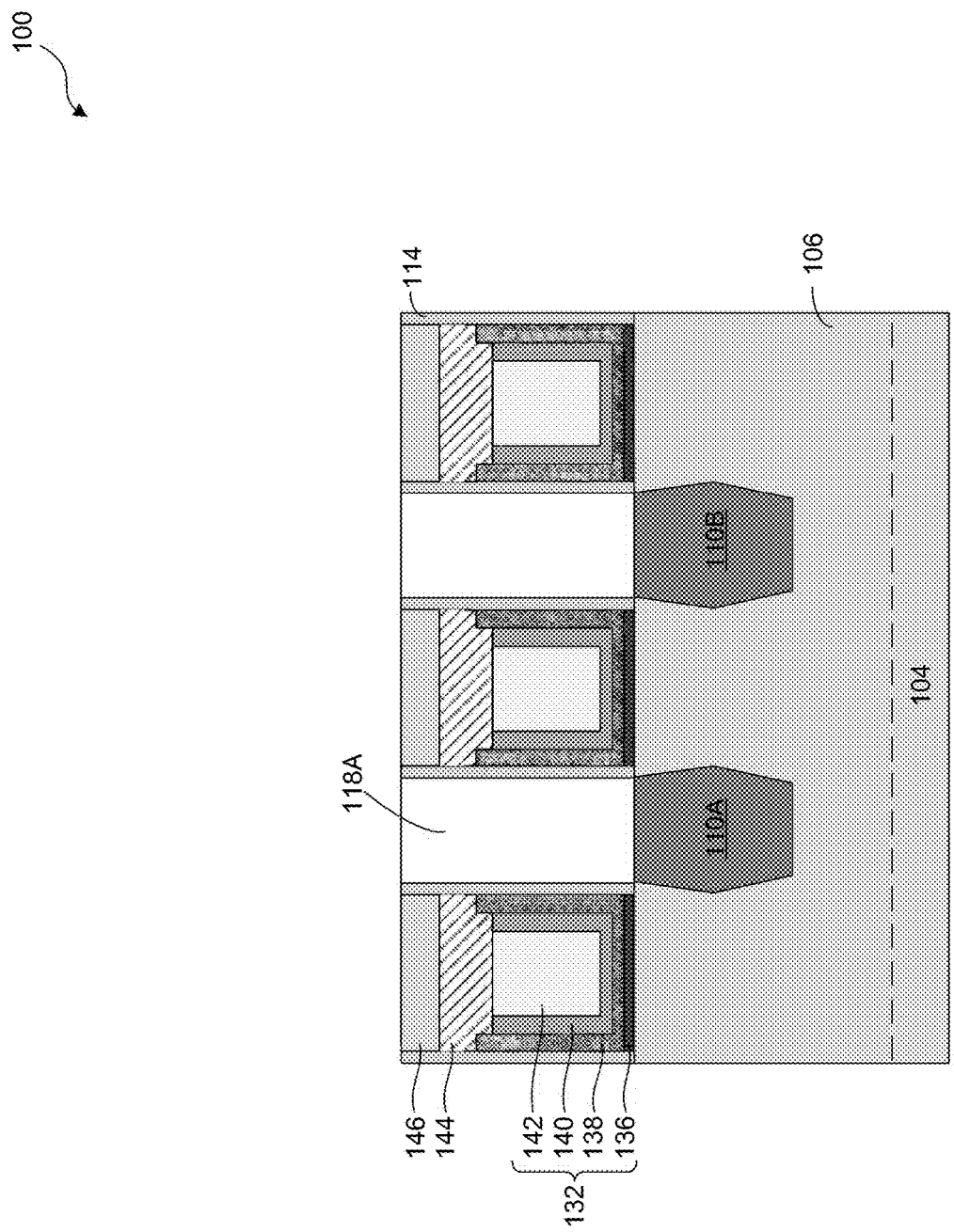

Referring to FIG. 2, in operation 220, insulating gate caps are formed on the conductive gate caps. For example, as shown in FIG. 9, insulating gate caps 146 are formed on conductive gate caps 144. The formation of insulating gate caps 146 can include sequential operations of (i) depositing an insulating nitride layer (not shown) on the structure of FIG. 8, and (ii) performing a CMP process on the insulating nitride layer to form the structure of FIG. 9. After the formation of insulating gate caps 146, ILD layer 1018 can be formed on the structure of FIG. 9.

Figure 10:
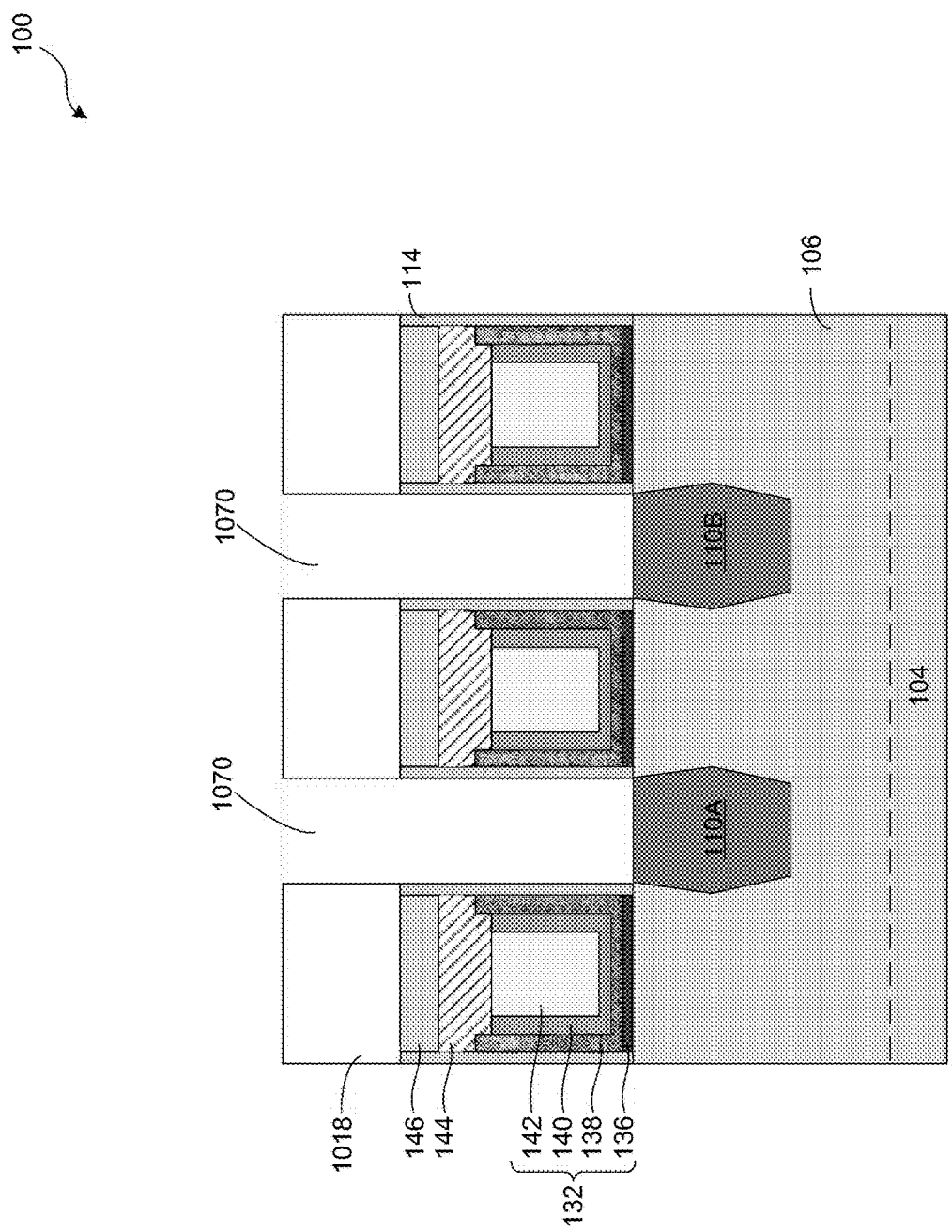
Figure 11:
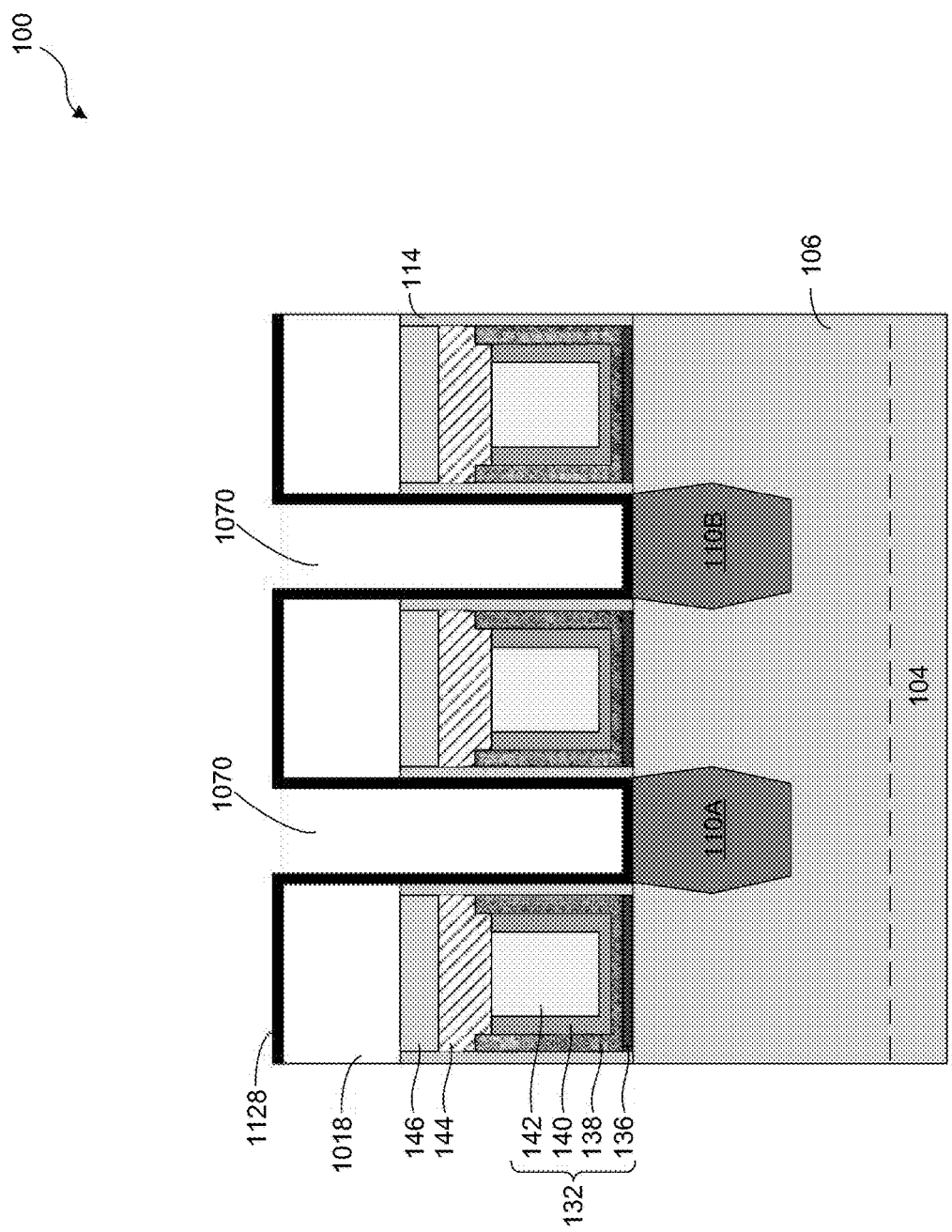
Figure 12:
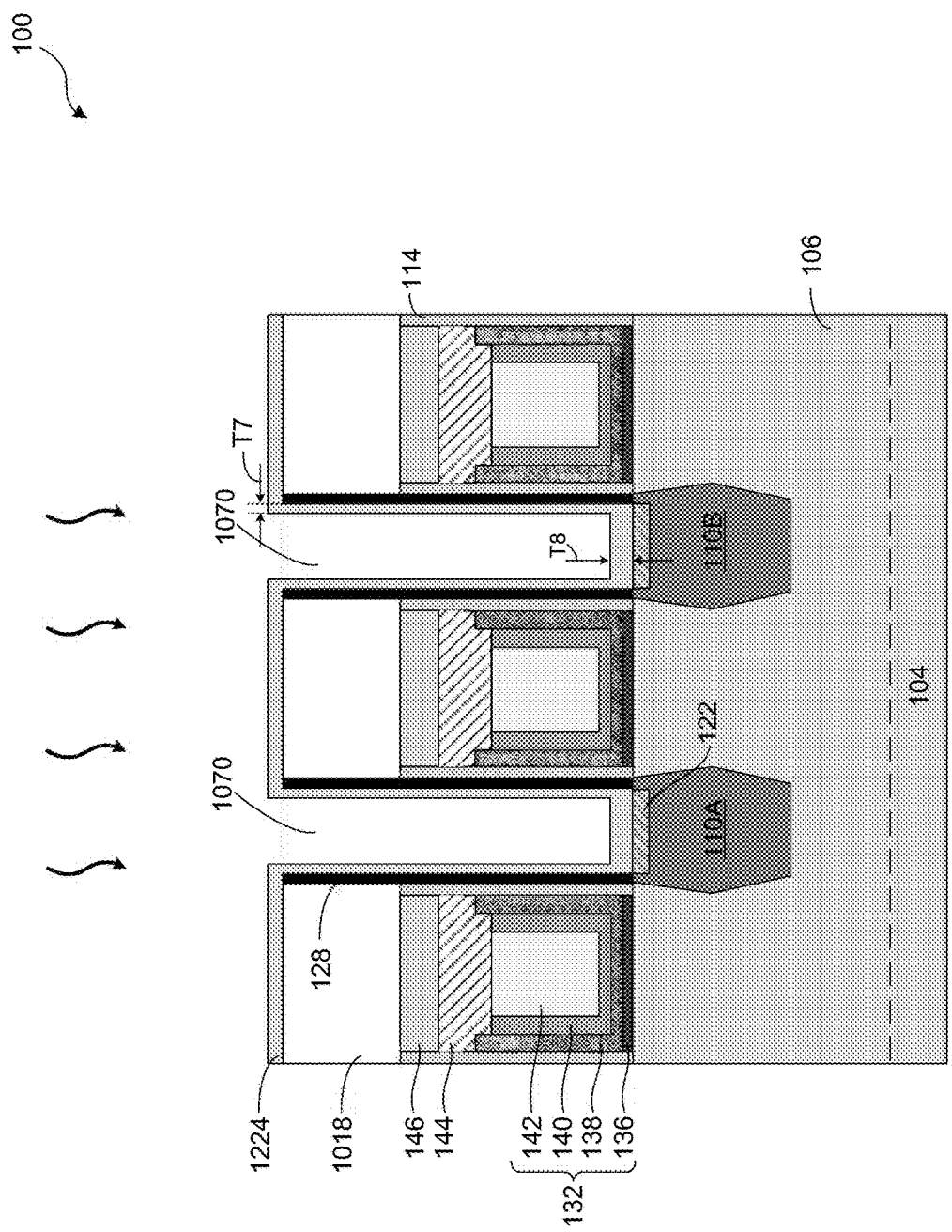
Figure 13:
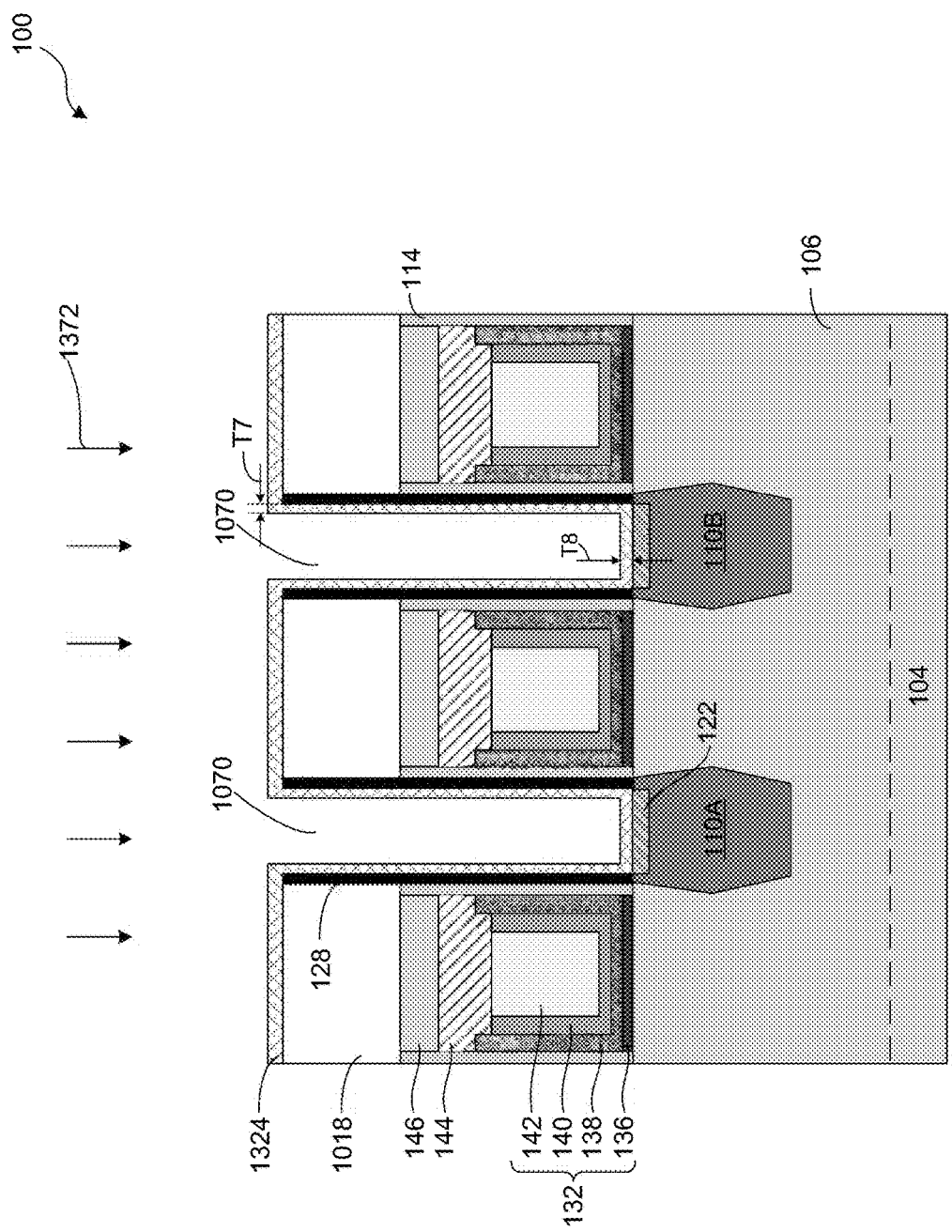
Figure 14:
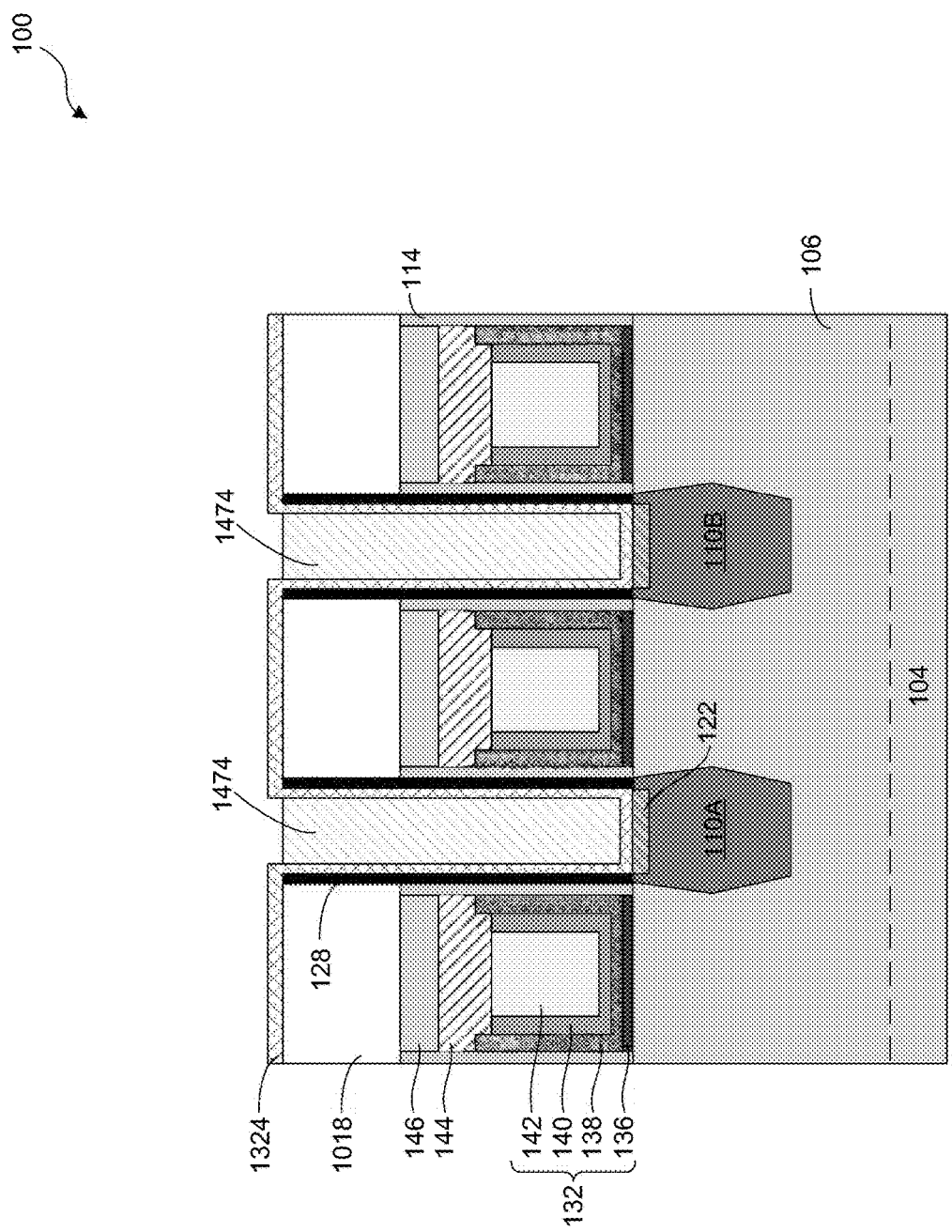
Figure 15:
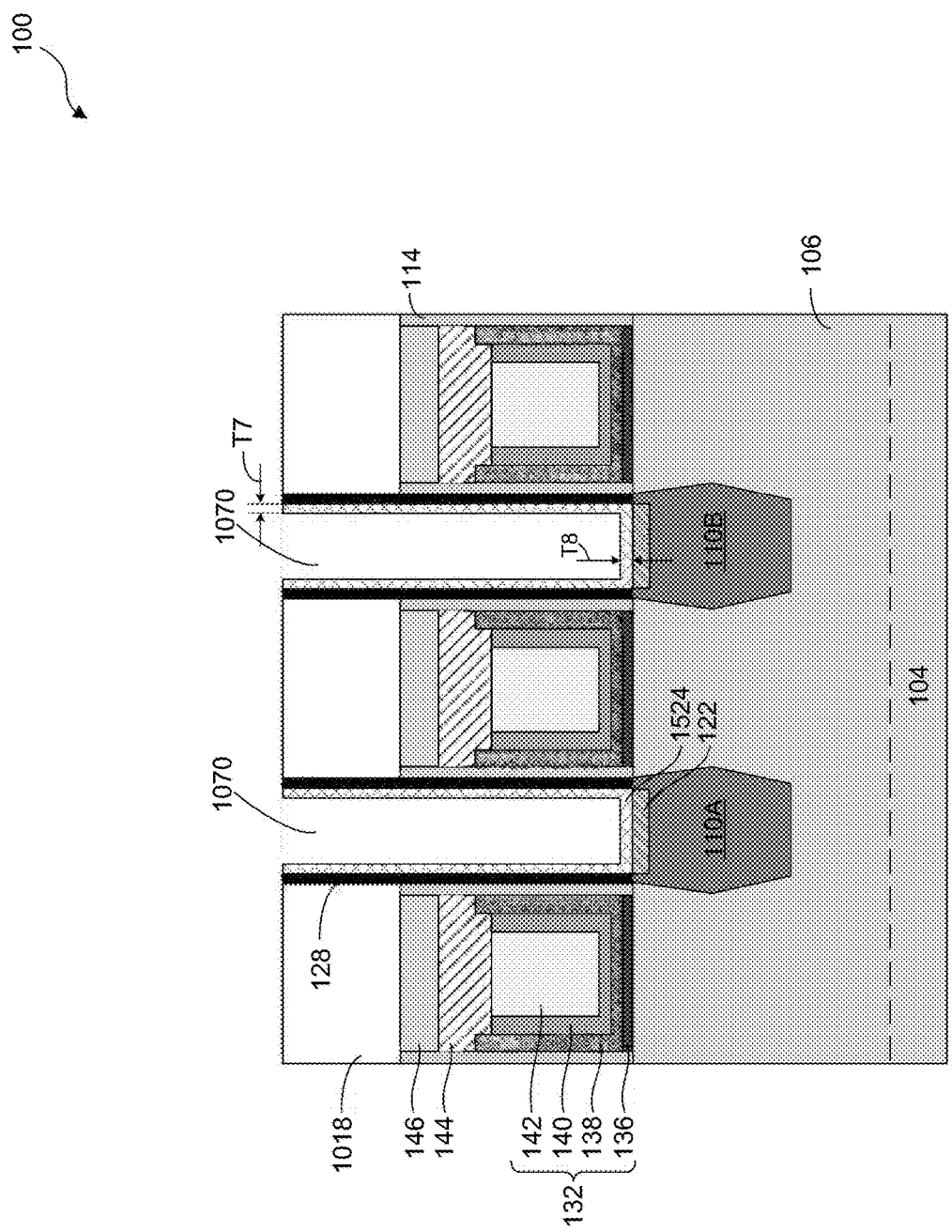
Figure 16:
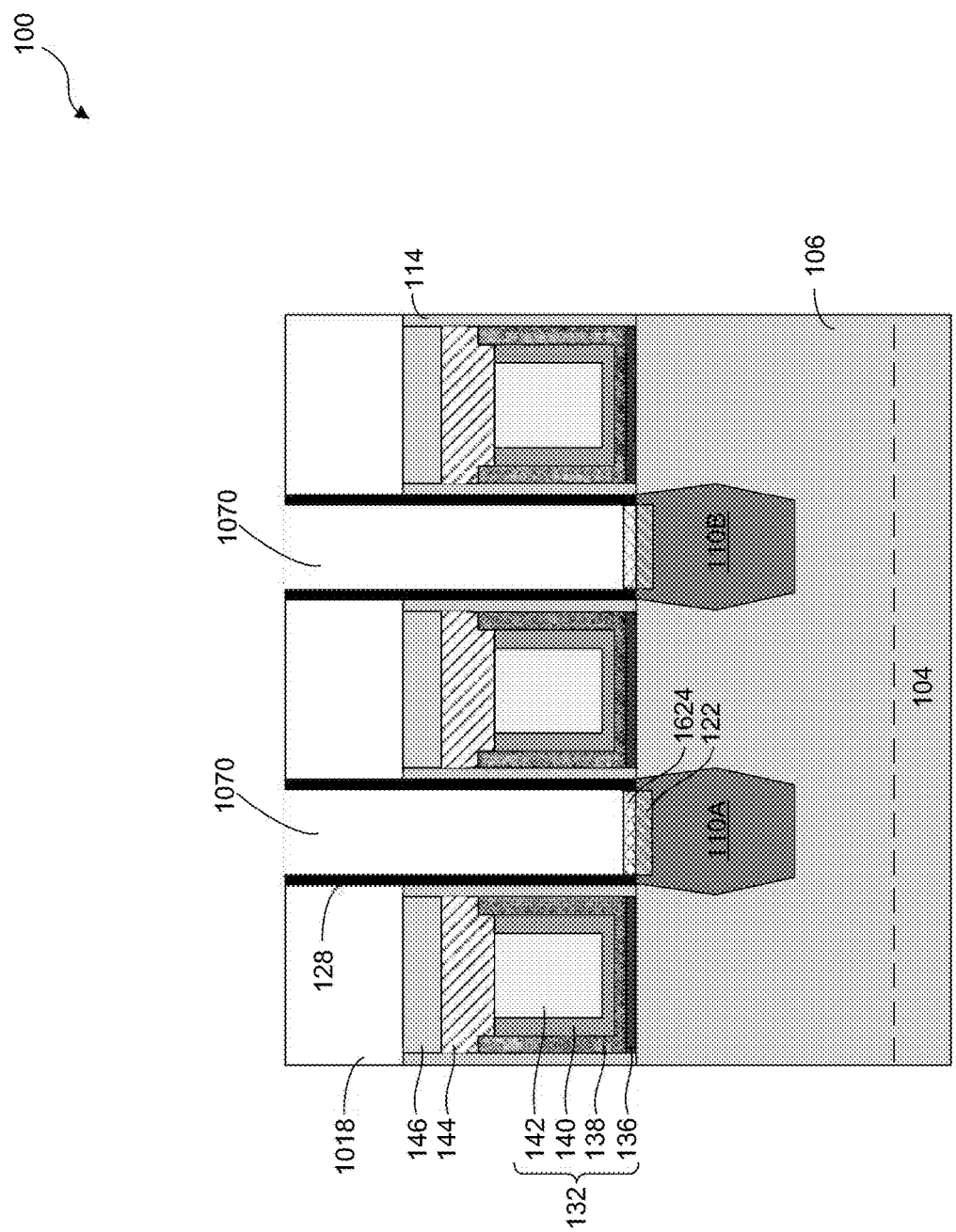
Figure 17:
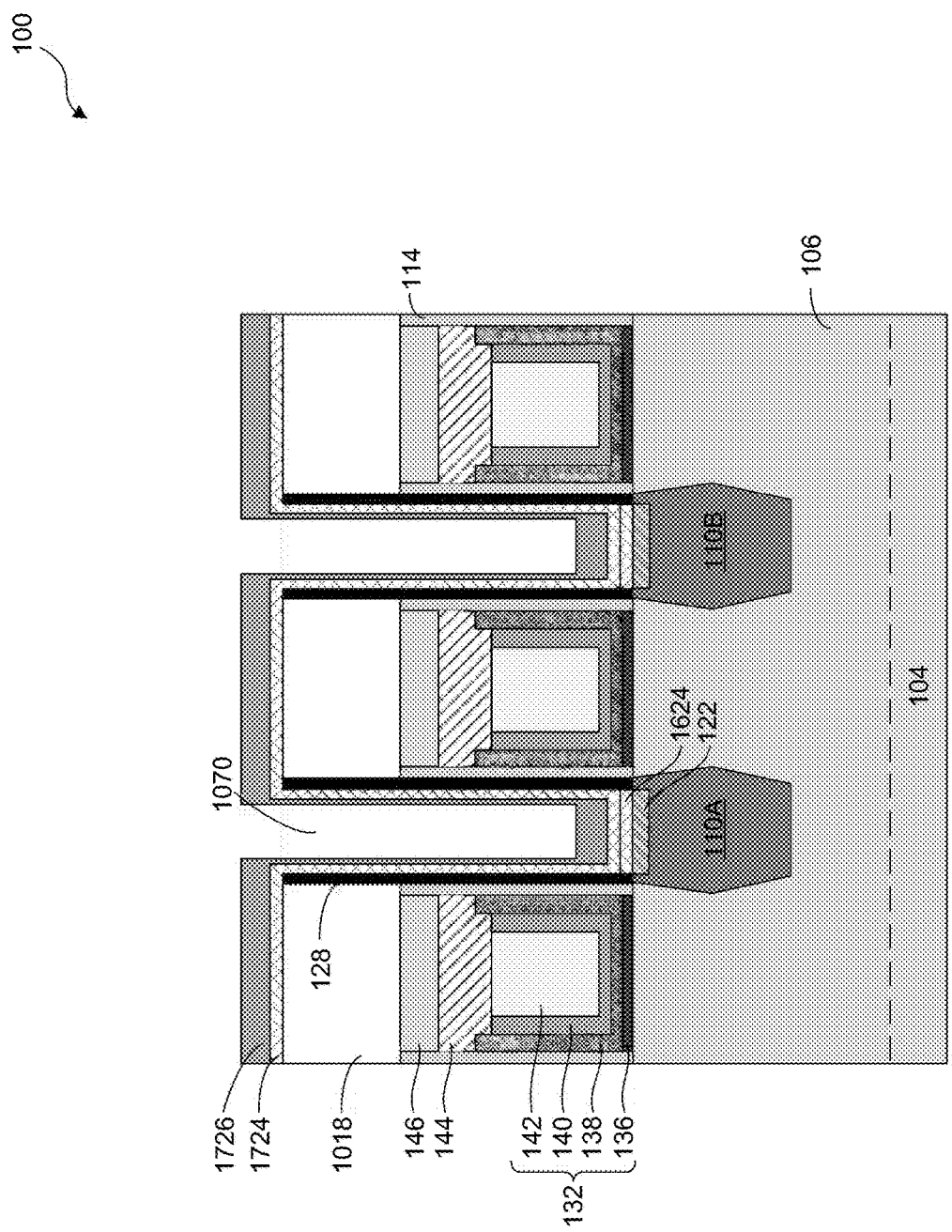
Figure 18:
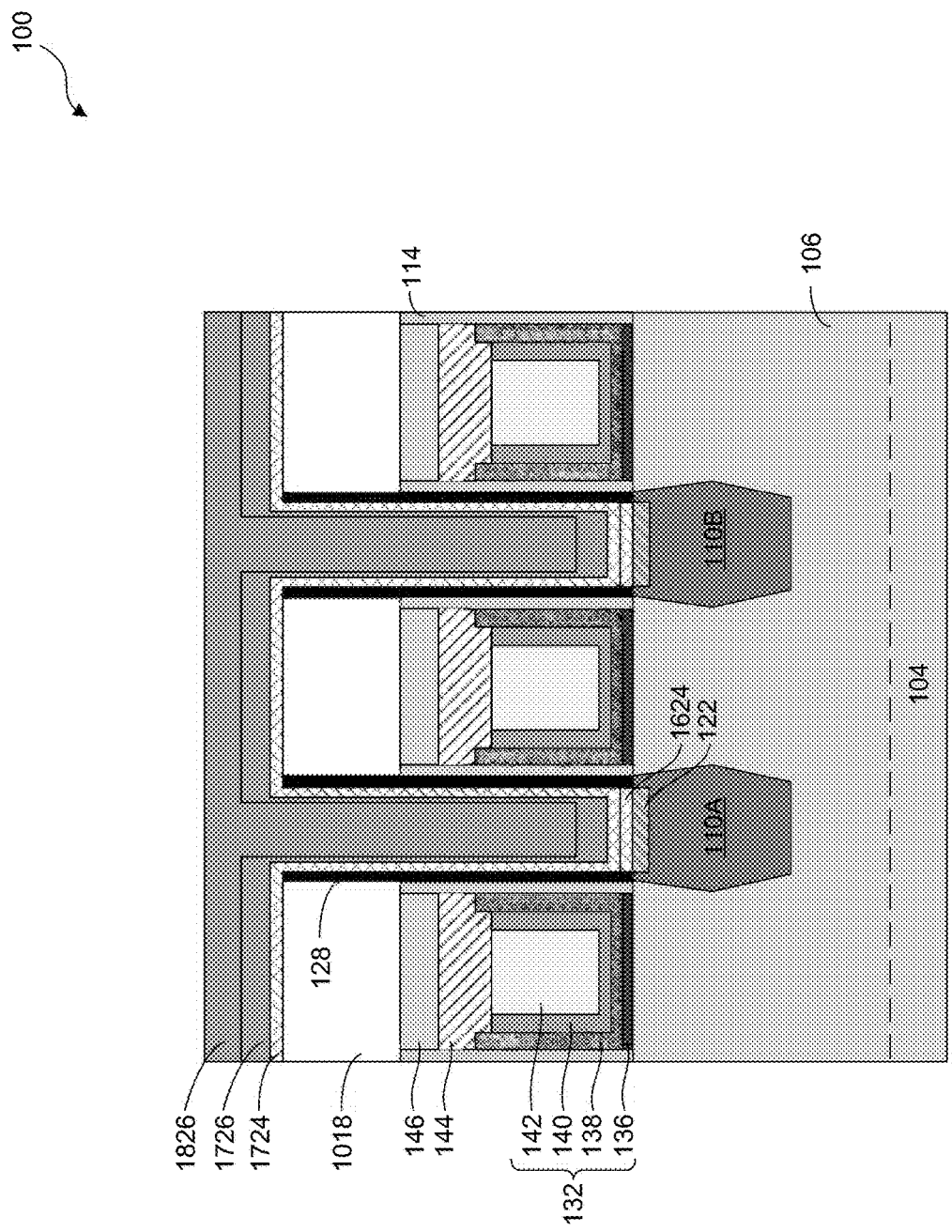
Figure 19:
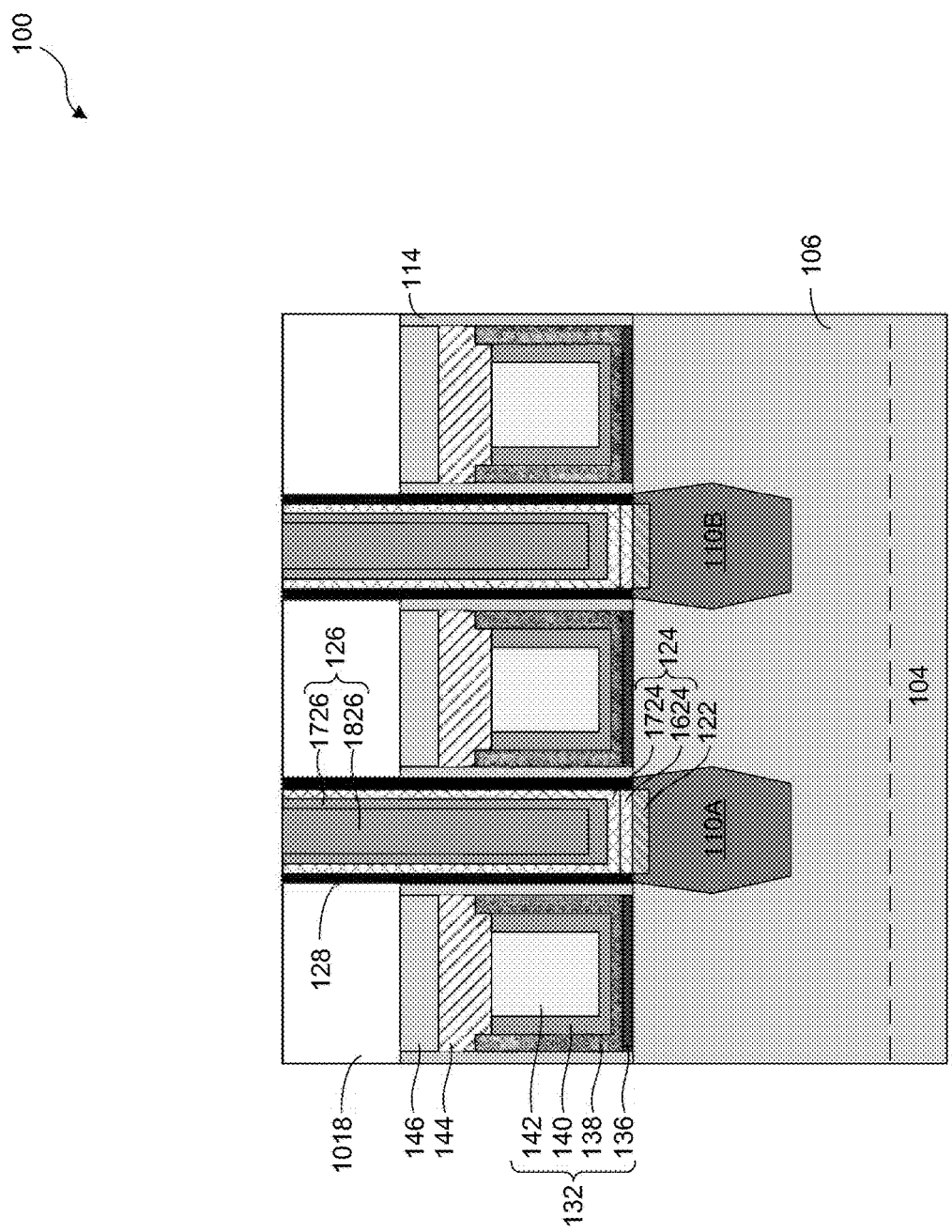
Figure 20:
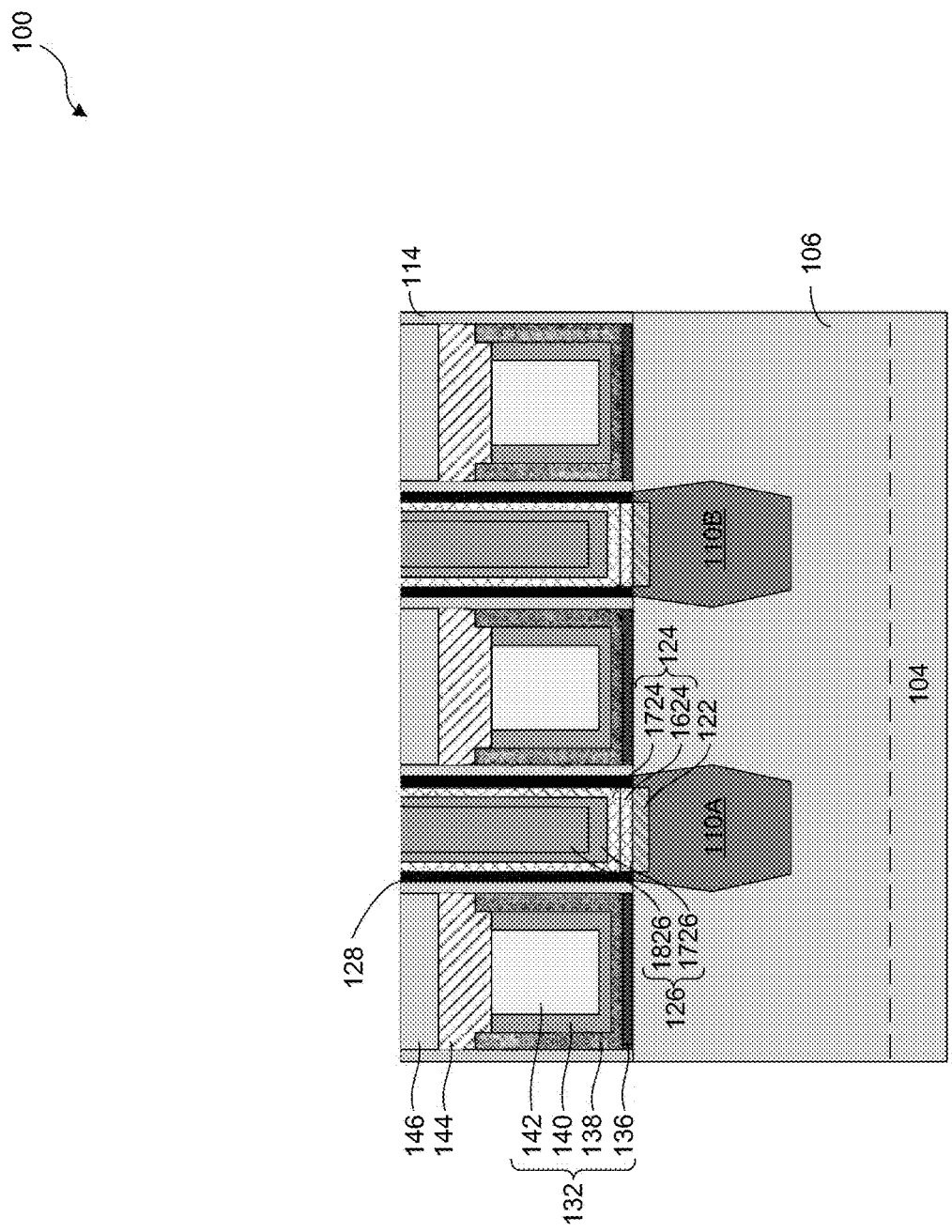
Figure 21:
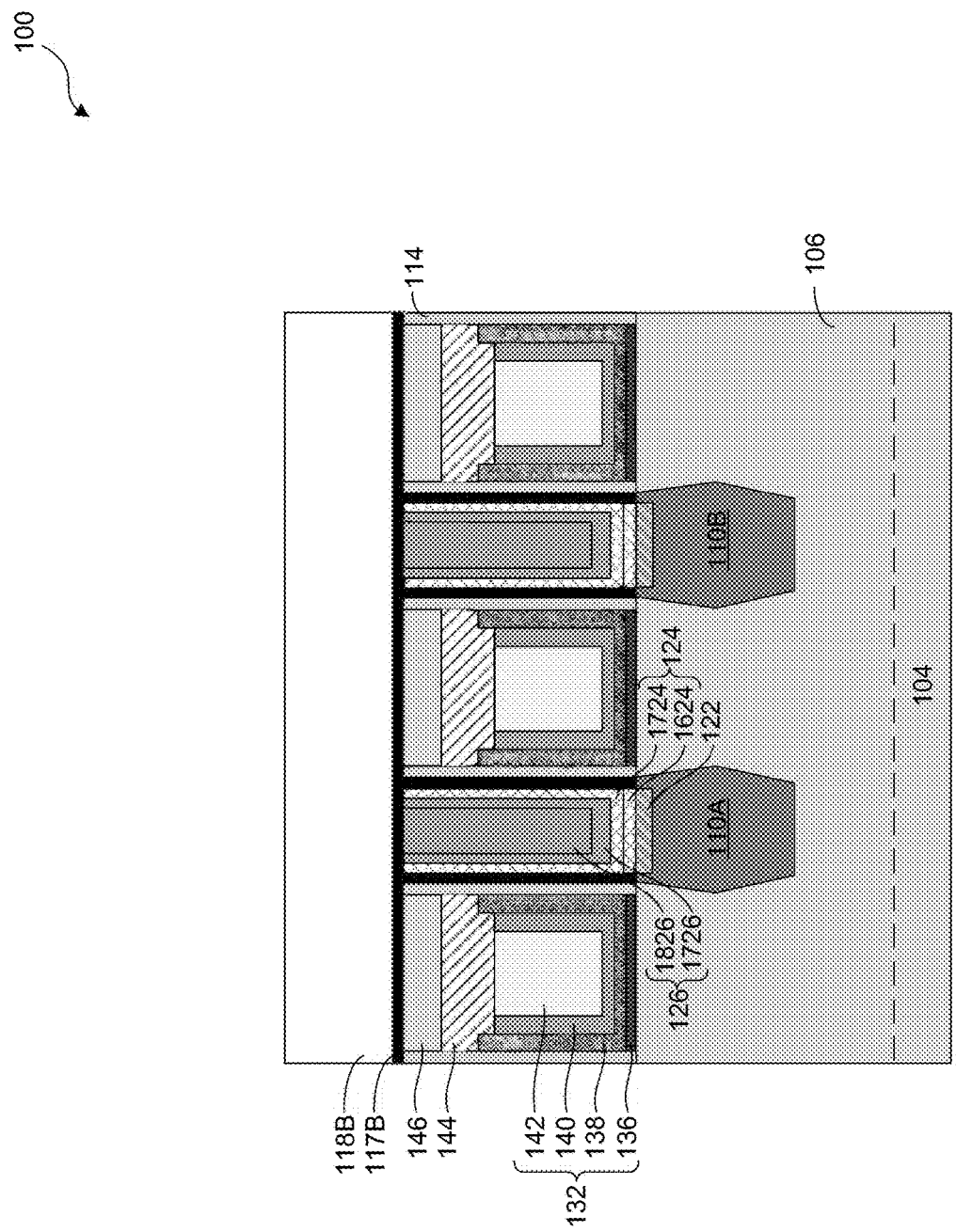

Referring to FIG. 2, in operation 225, S/D contact structures are formed on the S/D regions. For example, as described with reference to FIGS. 10-20, S/D contact structures 120A-120B are formed on respective S/D regions 110A-110B. The formation of S/D contact structures 120A-120B can include sequential operations of (i) forming S/D contact openings 1070 on S/D regions 110A-110B through ILD layers 118A and 1018, as shown in FIG. 10, (ii) depositing a dielectric nitride layer 1128 on the structure of FIG. 10, as shown in FIG. 11, (iii) selectively etching portions of dielectric nitride layer 1128 from the top surfaces of ILD layer 1018 and S/D regions 110A-110B to form diffusion barrier layer 128, as shown in FIG. 12, (iv) depositing a metal layer 1224, as shown in FIG. 12, (v) performing an annealing process on the structure after the deposition of metal layer 1224 to form silicide layers 122 within S/D regions 110A-110B, as shown in FIG. 12, (vi) performing a nitridation process on the structure of FIG. 12 using ammonia (NH3) or nitrogen gas 1372 to form metal nitride layer 1324, as shown in FIG. 13, (vii) forming masking layers 1474 (e.g., photoresist layers or anti-reflective coatings) on portions of metal nitride layer 1324 within S/D contact openings 1070 and with the top surfaces substantially coplanar with the top surfaces of ILD layer 1018, as shown in FIG. 14, (viii) etching portions of metal nitride layer 1324 from the top surfaces of ILD layer 1018 to form metal nitride layers 1524, as shown in FIG. 15, (ix) removing masking layers 1474, as shown in FIG. 15, (ix) selectively etching sidewall portions of metal nitride layers 1524 using a wet etch process (e.g., NH3 solution based wet etch process) to form metal nitride layers 1624, as shown in FIG. 16, (x) performing a cleaning process (e.g., fluorine-based dry etching process) on the structure of FIG. 16 to remove native oxides from the top surfaces of metal nitride layers 1624, (xi) depositing a metal nitride layer 1724 on the cleaned structure of FIG. 16, as shown in FIG. 17, (xii) depositing in-situ a metal layer 1726 on metal nitride layer 1724, as shown in FIG. 17, (xiii) depositing in-situ a metal layer 1826 on the structure of FIG. 17 to form the structure of FIG. 18, (xiv) performing a CMP process on the structure of FIG. 18 to form the structure of FIG. 19, and (xv) performing a CMP process and/or etching processes on the structure of FIG. 19 to form S/D contact structures 120A-120B, as shown in FIG. 20. After the formation of S/D contact structures 120A-120B, ESL 117B can be formed on the structure of FIG. 20 and ILD layer 118B can be formed on ESL 117B to form the structure of FIG. 21.

In some embodiments, the deposition of metal layer 1224 in FIG. 12 can include depositing a layer of Ti with a chemical vapor deposition (CVD) process at a temperature ranging from about 400° C. to about 500° C. Since Ti has a higher deposition selectivity for Si than for dielectric materials, the layer of Ti can be formed about 5 to about 8 times faster on S/D regions 110A-110B than on the sidewalls of diffusion barrier layers 128 and on the top surface of ILD layer 1018. As a result, metal layer 1224 and metal nitride layer 1324 can be formed with thicker portions of thickness T8 on S/D regions 110A-110B than the portions of thickness T7 on the sidewalls of diffusion barrier layers 128 and the top surface of ILD layer 1018. In some embodiments, a ratio (T7:T8) between thicknesses T7 and T8 can range from about 1:2 to about 1:4. In some embodiments, the anneal process after the formation of metal layer 1224 is not performed for the formation of silicide layers 122 if metal layer 1224 is formed in a CVD process because the CVD process temperature initiates the silicidation reaction between Si and the material of metal layer 1224 to form silicide layers 122.

In some embodiments, the deposition of metal layer 1224 in FIG. 12 can include depositing a layer of Ti with a physical vapor deposition (PVD) process at a room temperature. The PVD process can be adjusted to grow metal layer 1224 with thicker portions of thickness T8 on S/D regions 110A-110B than the portions of thickness T7 on the sidewalls of diffusion barrier layers 128 and the top surface of ILD layer 1018. Since the PVD process is performed at room temperature, the anneal process after the formation of metal layer 1224 is performed for the formation of silicide layers 122.

Adhesion layers 124 are formed with dual metal nitride layers 1624 and 1724, as shown in FIG. 20. In some embodiments, metal nitride layer 1724 is not formed when contact plugs 126 include metals, such as W, Ru, Ir, and Mo that may not need a layer to promote adhesion with the material of diffusion barrier layers 128, and as a result S/D contact structures 120A-120B as shown in FIG. 1C are formed.

In some embodiments, metal nitride layer 1724 can be deposited with a thickness of about 1 nm to about 2 nm using an ALD process at a temperature of about 400° C. to about 450° C. In some embodiments, the deposition of metal nitride layer 1724 can include depositing a TiN layer in an ALD process using ammonia gas and titanium chloride precursor or tetrakis(dimethylamino)titanium (TDMAT) precursor. Other thicknesses and temperature ranges are within the scope of the disclosure. In some embodiments, metal nitride layer 1724 can include a metal similar to or different from the metal included in metal nitride layer 1624.

The formation of metal nitride layer 1724 and metal layers 1726 and 1826 are an in-situ process to prevent the oxidation of metal nitride layer 1724, and consequently prevent the oxidation of underlying silicide layers 122. In some embodiments, metal layer 1726 can include a metal similar to or different from the metal included in metal layer 1826.

Figure 22:
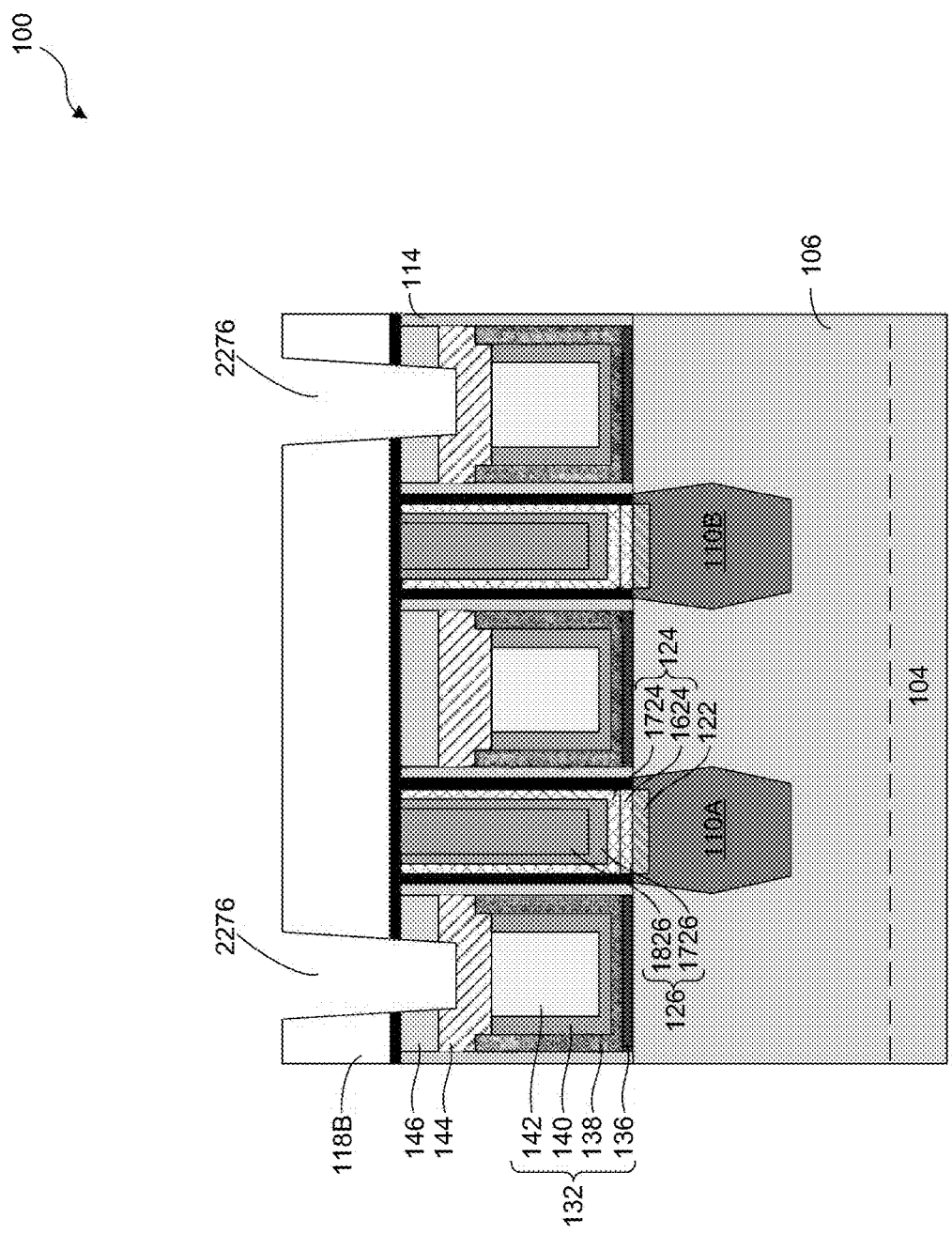
Figure 23:
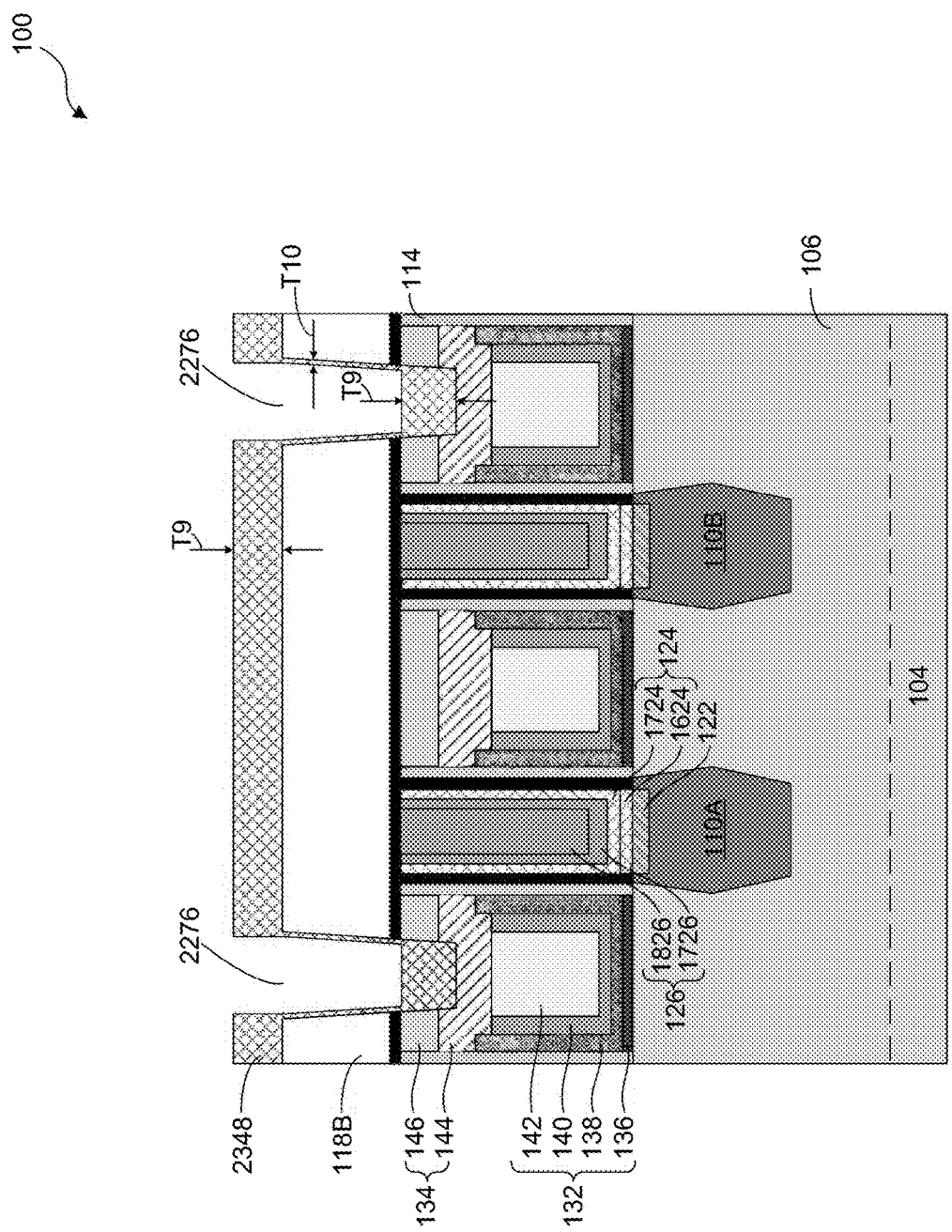
Figure 24:
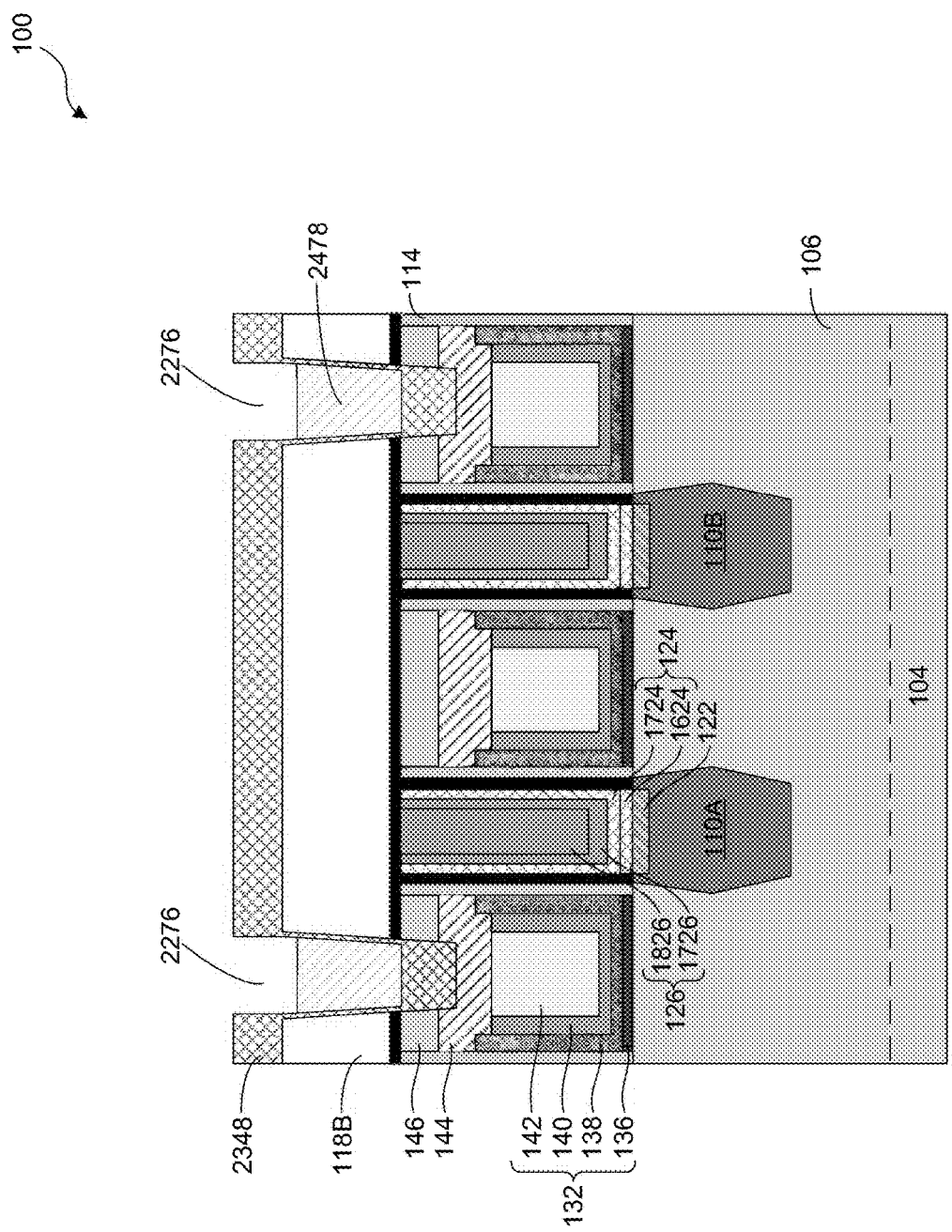
Figure 25:
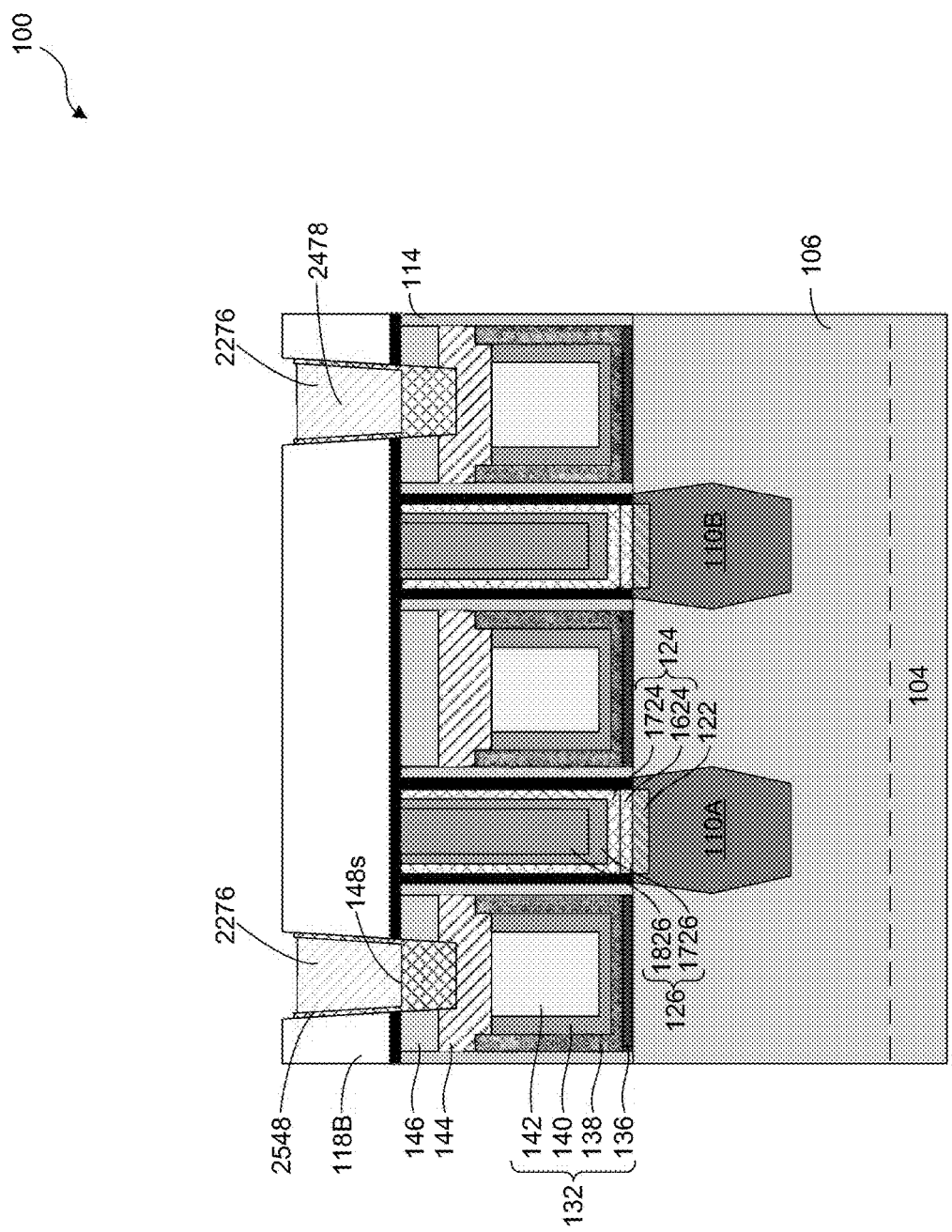
Figure 26:
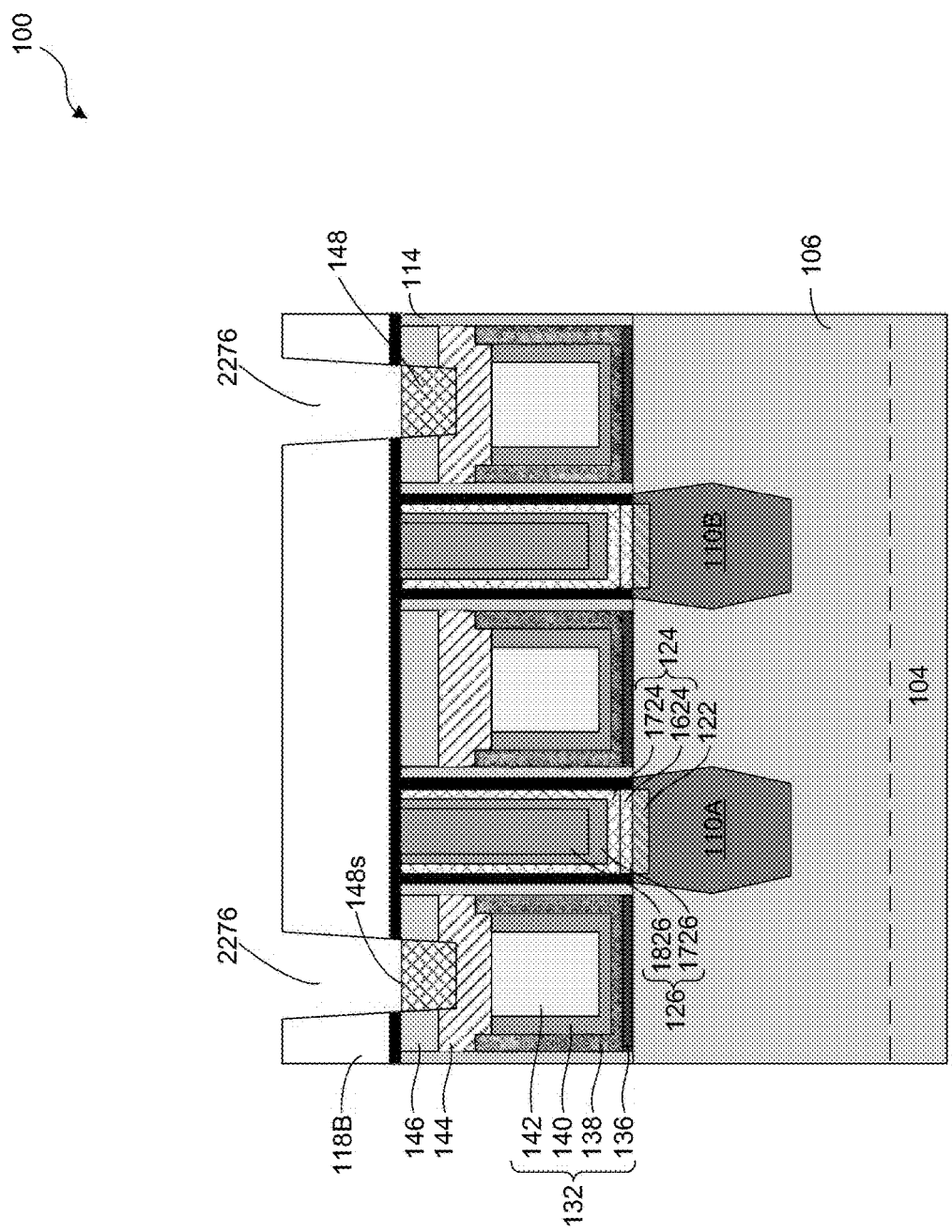
Figure 27:
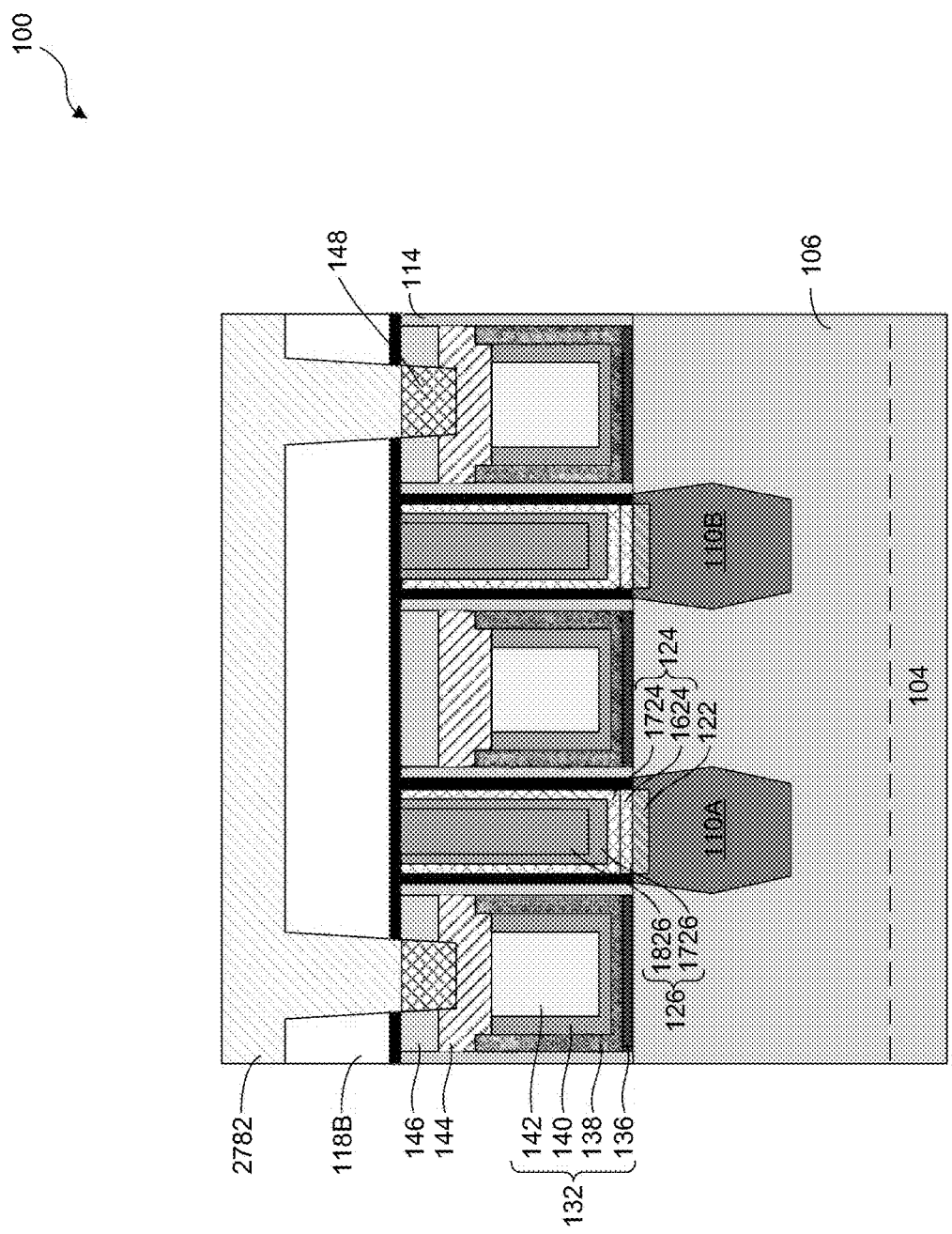

Referring to FIG. 2, in operation 230, gate contact structures are formed on the gate structures. For example, as described with reference to FIGS. 22-26, gate contact structures 148 are formed on gate structures 112A and 112C. The formation of gate contact structures 148 can include sequential operations of (i) forming gate contact openings 2276 extending into conductive gate caps 144, as shown in FIG. 22, (ii) depositing a metal layer 2348 on the structure of FIG. 22 to form the structure of FIG. 23, (iii) forming masking layers 2478 (e.g., photoresist layers or anti-reflective coatings) on portions of metal layer 2348 within gate contact openings 2276, as shown in FIG. 24, (iv) etching (e.g., wet etching) metal layer 2348 to form metal layers 2548 with top surfaces substantially coplanar with top surfaces of masking layers 2478, as shown in FIG. 25, (v) removing masking layers 2478 from the structure of FIG. 25, and (vi) etching sidewall portions of metal nitride layers 2548 extending above top surfaces 148s from the structure of FIG. 25 to form gate contact structures 148, as shown in FIG. 26.

The formation of metal layer 2348 can include depositing a metal layer using a directional deposition process, such as a PVD. The PVD process parameters can be adjusted to form metal layer 2348 with portions of different thicknesses along the sidewalls of gate contact openings 2276 and on ILD layer 118B and within gate capping structures 134. In some embodiments, the portions of metal layer 2348 along the sidewalls of gate contact openings 2276 have a thickness T10 and the portions of metal layer 2348 on ILD layer 118B and within gate capping structures 134 have a thickness T9, which is greater than thickness T10. In some embodiments, a ratio (T10:T9) between thicknesses T10 and T9 can range from about 1:2 to about 1:5. The portions of metal layer 2348 along the sidewalls of gate contact openings 2276 are formed thinner than those within gate capping structures 134 for the ease of selectively removing the portions along the sidewalls.

Figure 28:
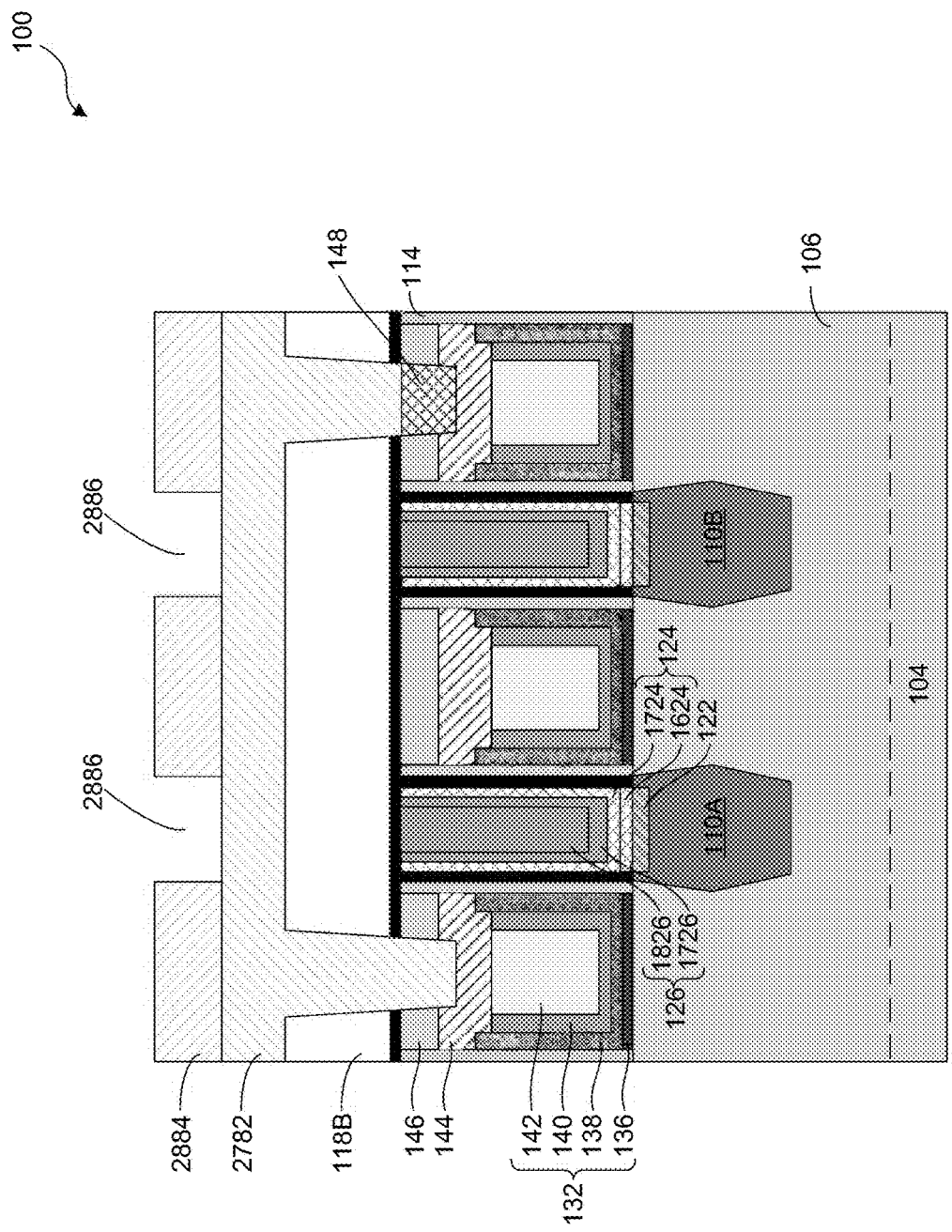
Figure 29:
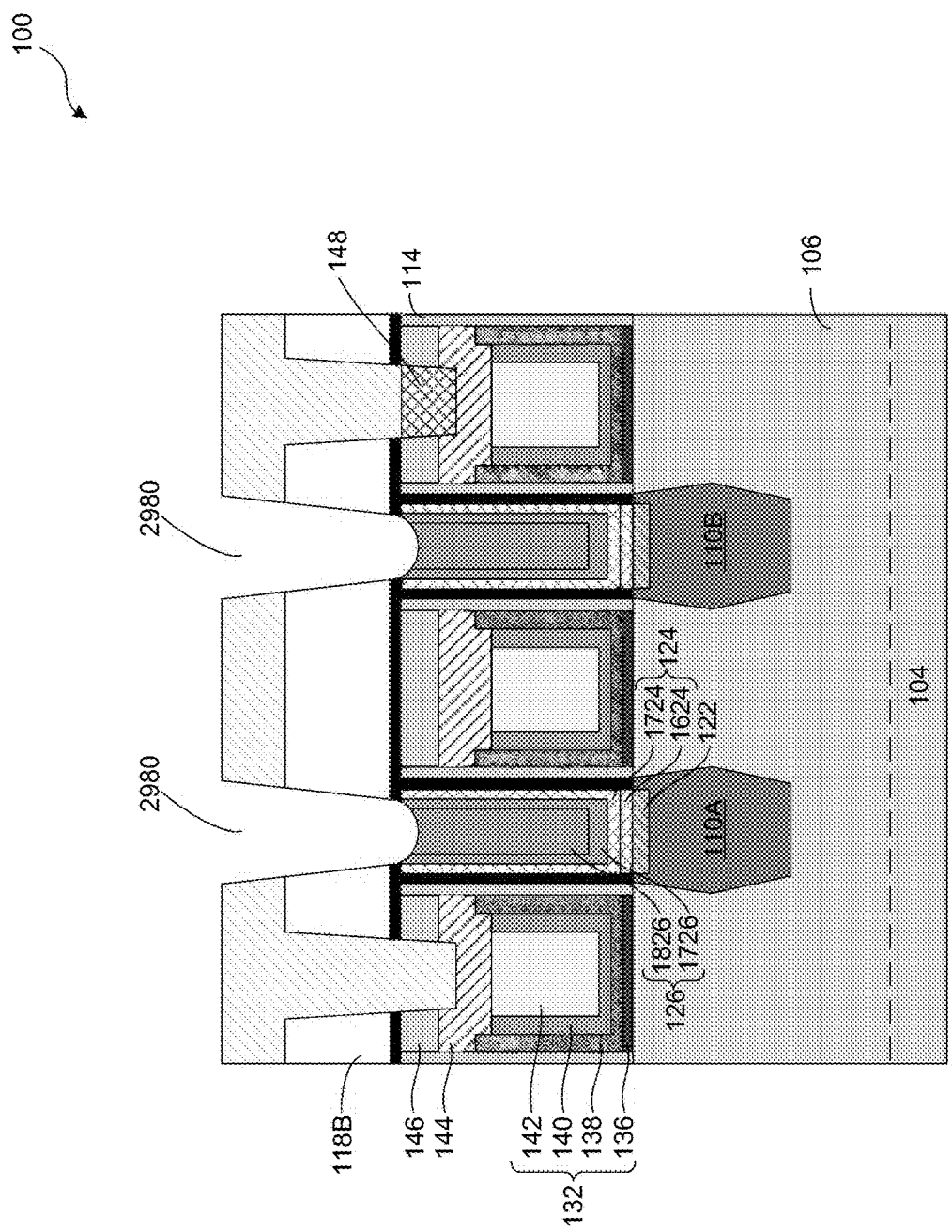
Figure 30:
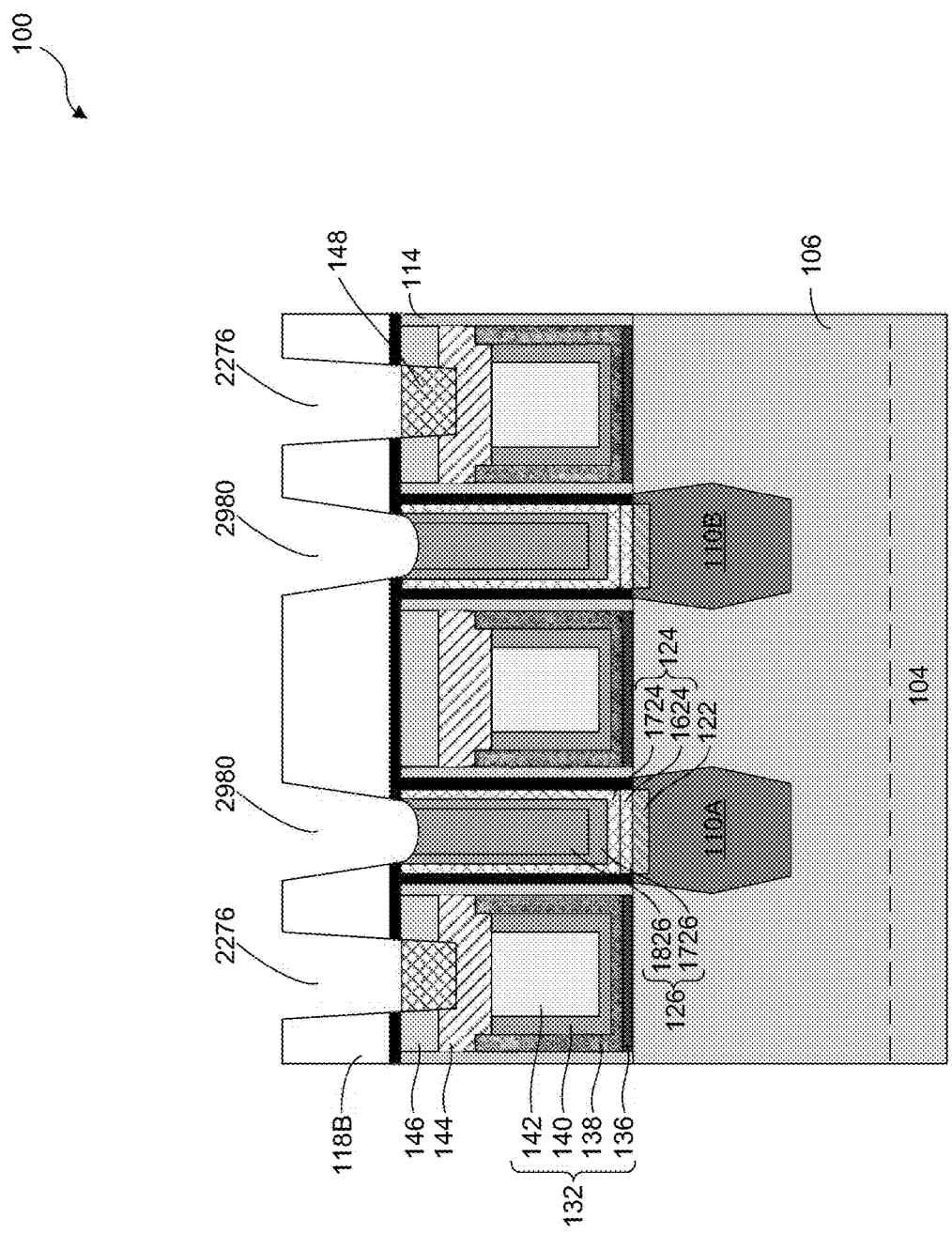

Referring to FIG. 2, in operation 235, S/D via openings are formed on the S/D contact structures. For example, as described with reference to FIGS. 27-30, S/D via openings 2980 are formed on S/D contact structures 120A-120B. The formation of S/D via openings 2980 can include sequential operations of (i) depositing a masking layer 2782 on the structure of FIG. 26 to form the structure of FIG. 27, (ii) forming a patterned masking layer 2884 with openings 2886 on masking layer 2782, as shown in FIG. 28, (iii) etching portions of masking layer 2782 and ILD layer 118B underlying openings 2886 to form S/D via openings 2980, as shown in FIG. 29, and (iv) removing masking layers 2782 and 2884 to form the structure of FIG. 30.

Figure 31:
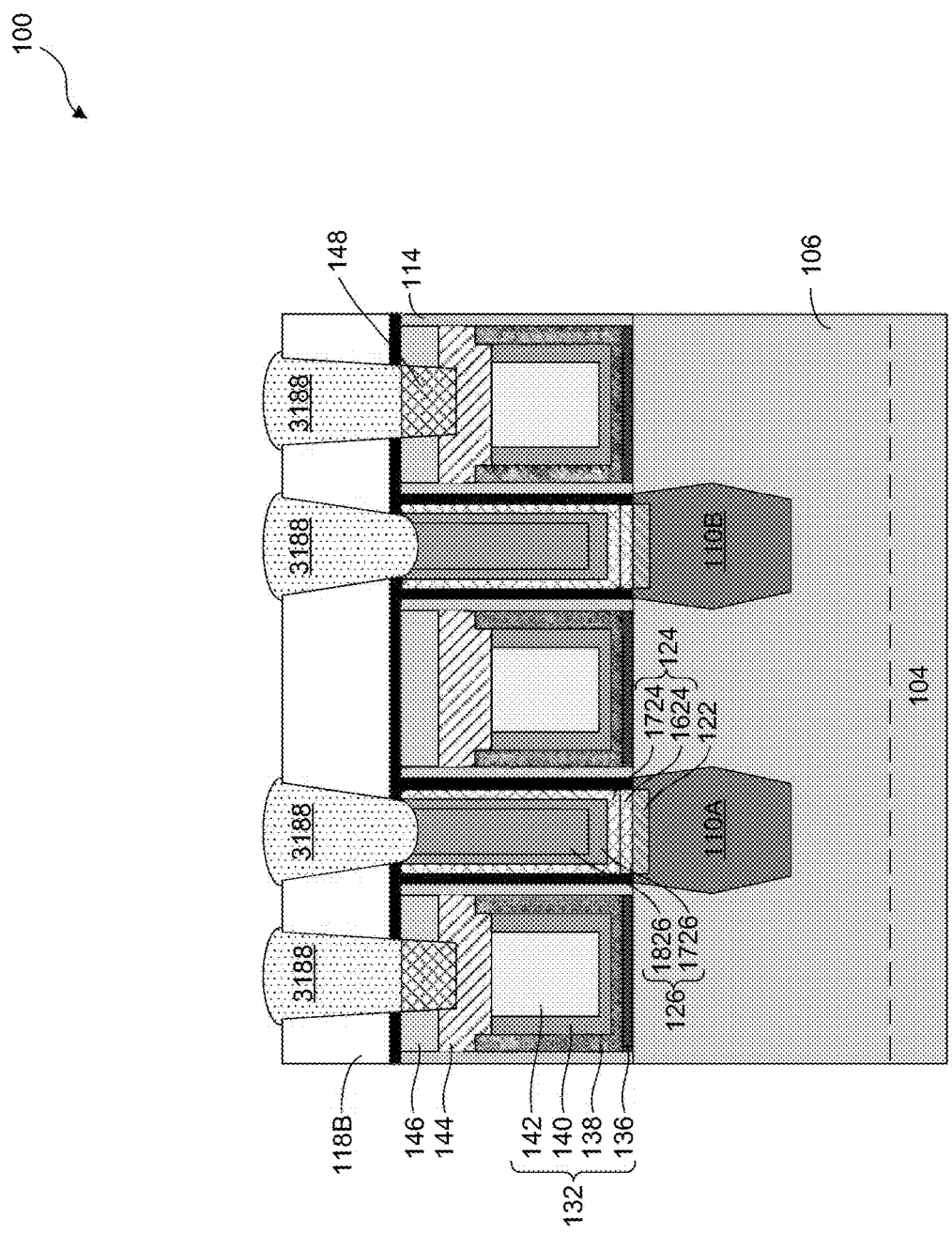
Figure 32:
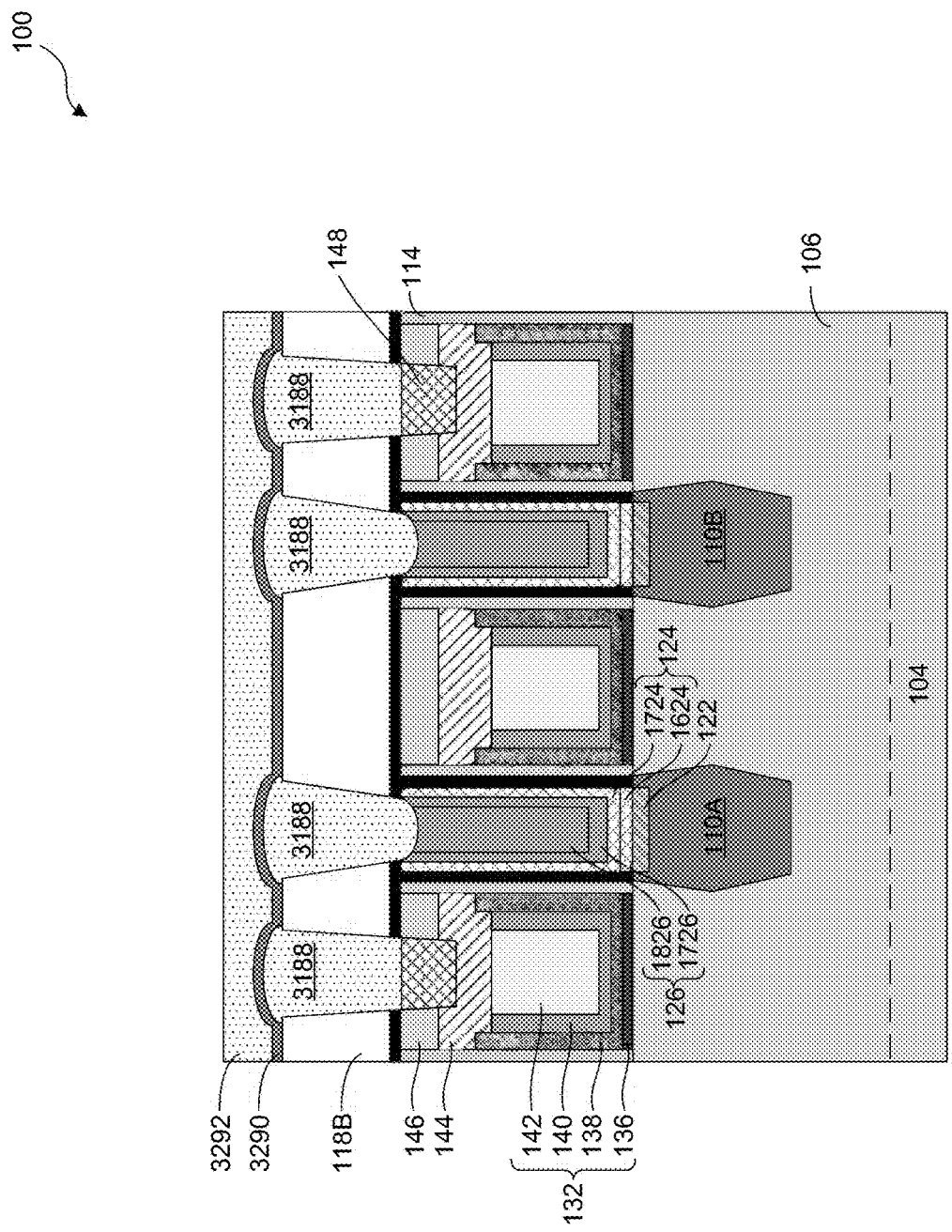
Figure 33:
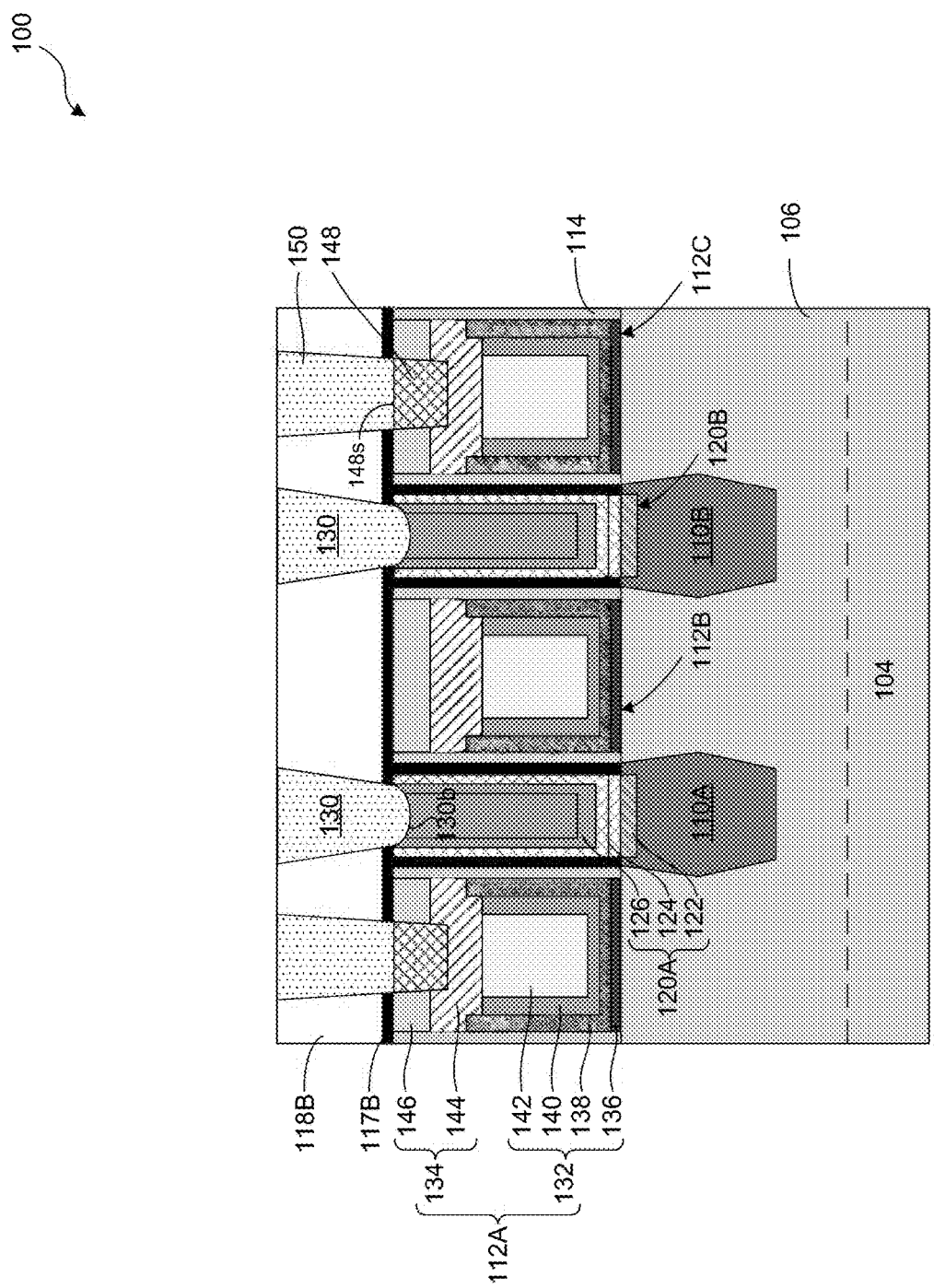

Referring to FIG. 2, in operation 240, S/D via structures and gate via structures are formed on the S/D contact structures and the gate contact structures, respectively. For example, as described with reference to FIGS. 30-33, S/D via structures 130 and gate via structures 150 are formed on S/D contact structures 120A-120B and gate contact structures 148. The formation of S/D via structures 130 and gate via structures 150 can include sequential operations of (i) depositing metal layers 3188 within S/D via openings 2980 and gate contact openings 2276, as shown in FIG. 31, (ii) depositing a glue layer 3290 substantially conformally on the structure of FIG. 31, as shown in FIG. 32, (iii) depositing a metal layer 3292 on glue layer 3290, as shown in FIG. 32, and (iv) performing a CMP process on the structure of FIG. 32 to form S/D via structures 130 and gate via structures 150, as shown in FIG. 33.

In some embodiments, metal layers 3188 can be deposited using a bottom-up deposition process with $WF_6$ and $H_2$ precursor gases at a temperature ranging from about 250° C. to about 300° C. and at a pressure ranging from about 2 torr to about 10 torr. Other thicknesses, temperatures, and pressure ranges are within the scope of the disclosure. Glue layer 3290 can be deposited for promoting deposition of metal layer 3188 with thickness ranging from about 3 nm to about 5 nm using $WF_6$ and $H_2$ precursor gases at a temperature ranging from about 250° C. to about 300° C. and at a pressure ranging from about 2 torr to about 10 torr. Other thicknesses, temperatures, and pressure ranges are within the scope of the disclosure. In some embodiments, the metal layer 3188 and 3292 can have the same materials.

Figure 34:
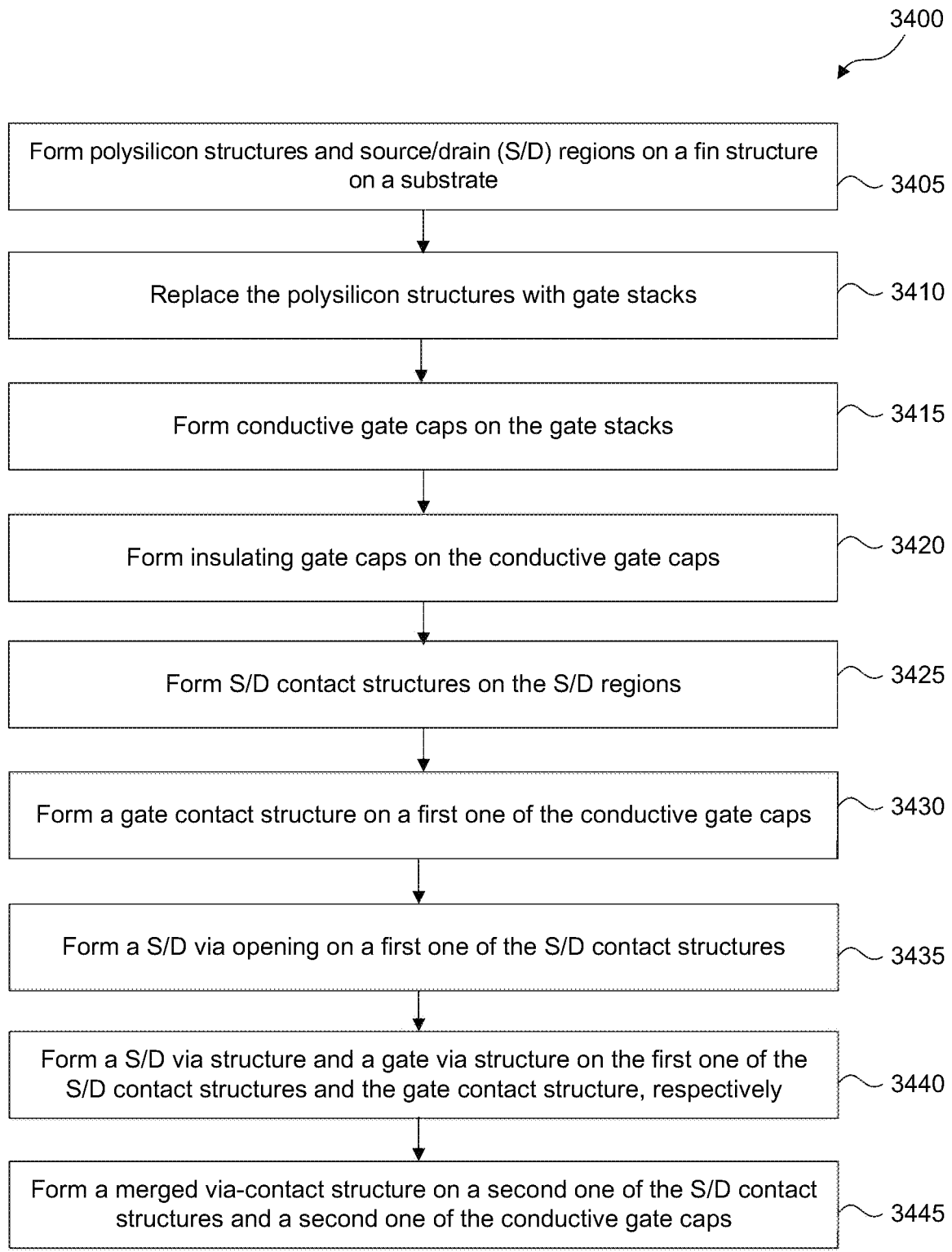
FIG. 34 is a flow diagram of a method for fabricating a semiconductor device with gate contact and via structures, in accordance with some embodiments.

FIG. 34 is a flow diagram of an example method 3400 for fabricating FET 100 with cross-sectional view shown in FIG. 1E, according to some embodiments. For illustrative purposes, the operations illustrated in FIG. 34 will be described with reference to the example fabrication process for fabricating FET 100 as illustrated in FIGS. 3-33 and FIGS. 35-38. FIGS. 3-33 and FIGS. 35-38 are cross-sectional views of FET 100 along line A-A of FIG. 1A at various stages of fabrication, according to some embodiments. Operations can be performed in a different order or not performed depending on specific applications. It should be noted that method 3400 may not produce a complete FET 100. Accordingly, it is understood that additional processes can be provided before, during, and after method 3400, and that some other processes may only be briefly described herein. Elements in FIGS. 3-33 and FIGS. 35-38 with the same annotations as elements in FIGS. 1A-1E are described above.

Figure 35:
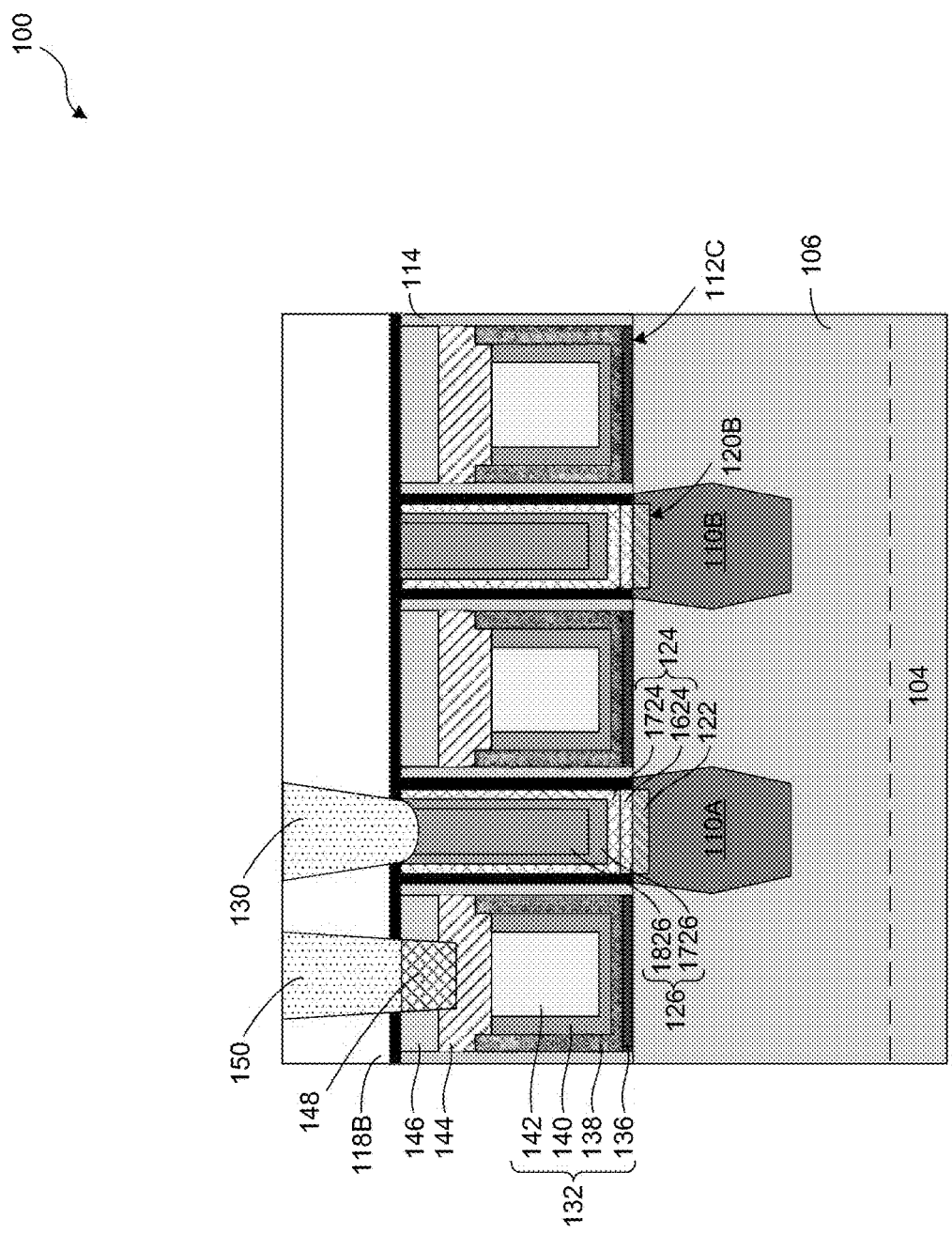
FIGS. 35-38 illustrate cross-sectional views of a semiconductor device with gate contact and via structures at various stages of its fabrication process, in accordance with some embodiments.

Referring to FIG. 34, the discussion of operations 205-240 of FIG. 2 applies to operations 3405-3440, unless mentioned otherwise. Unlike operations 230-240, in operations 3430-3440, gate contact structure 148 is not formed on gate structure 112C, S/D via opening 2980 is not formed on S/D contact structure 120B, S/D via structure 130 is not formed on S/D contact structure 120B, and gate via structure 150 is not formed over gate structure 112C. As a result, after operation 3440, the structure shown in FIG. 35 is formed without gate contact structure 148 on gate structure 112C, S/D via structure 130 on S/D contact structure 120B, and gate via structure 150 over gate structure 112C.

Figure 36:
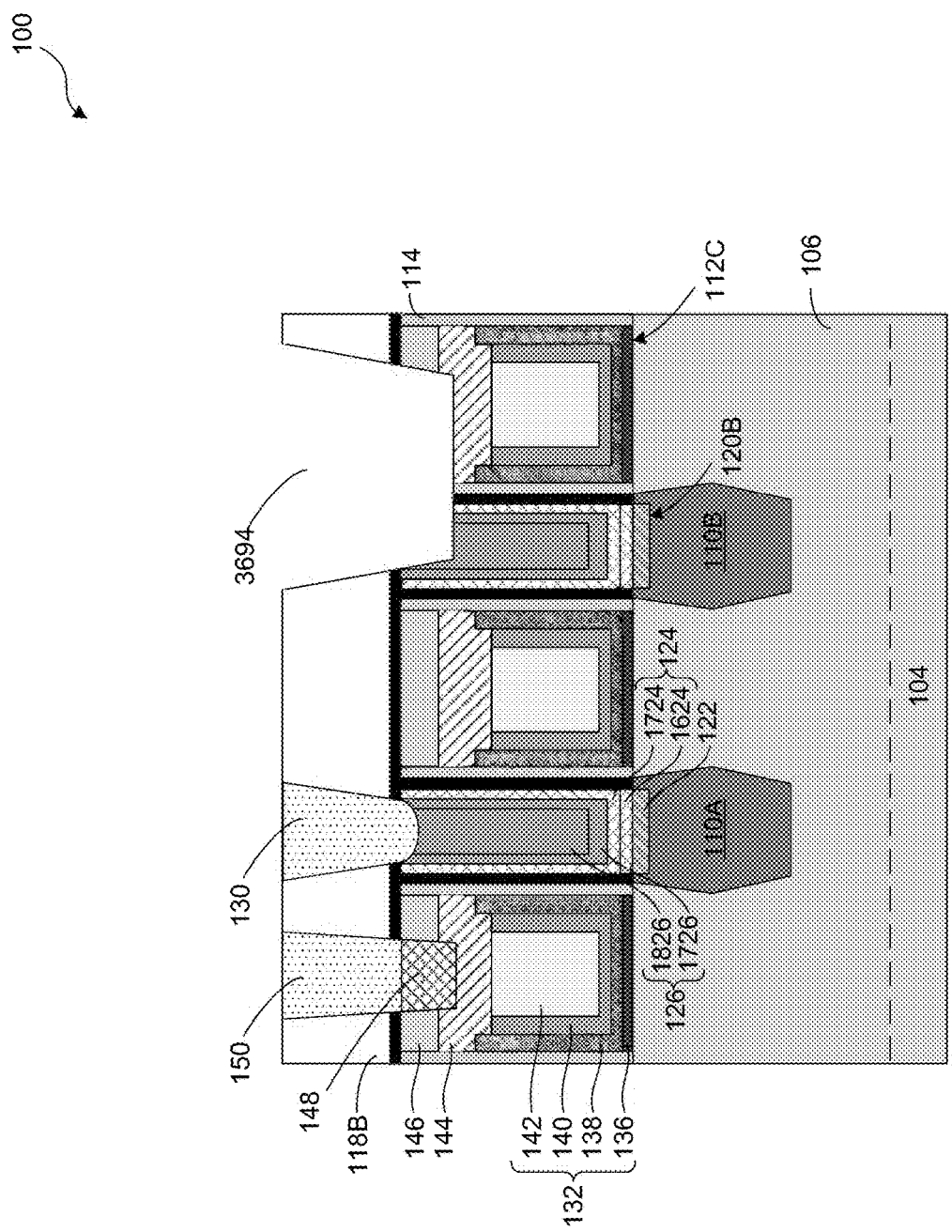
Figure 37:
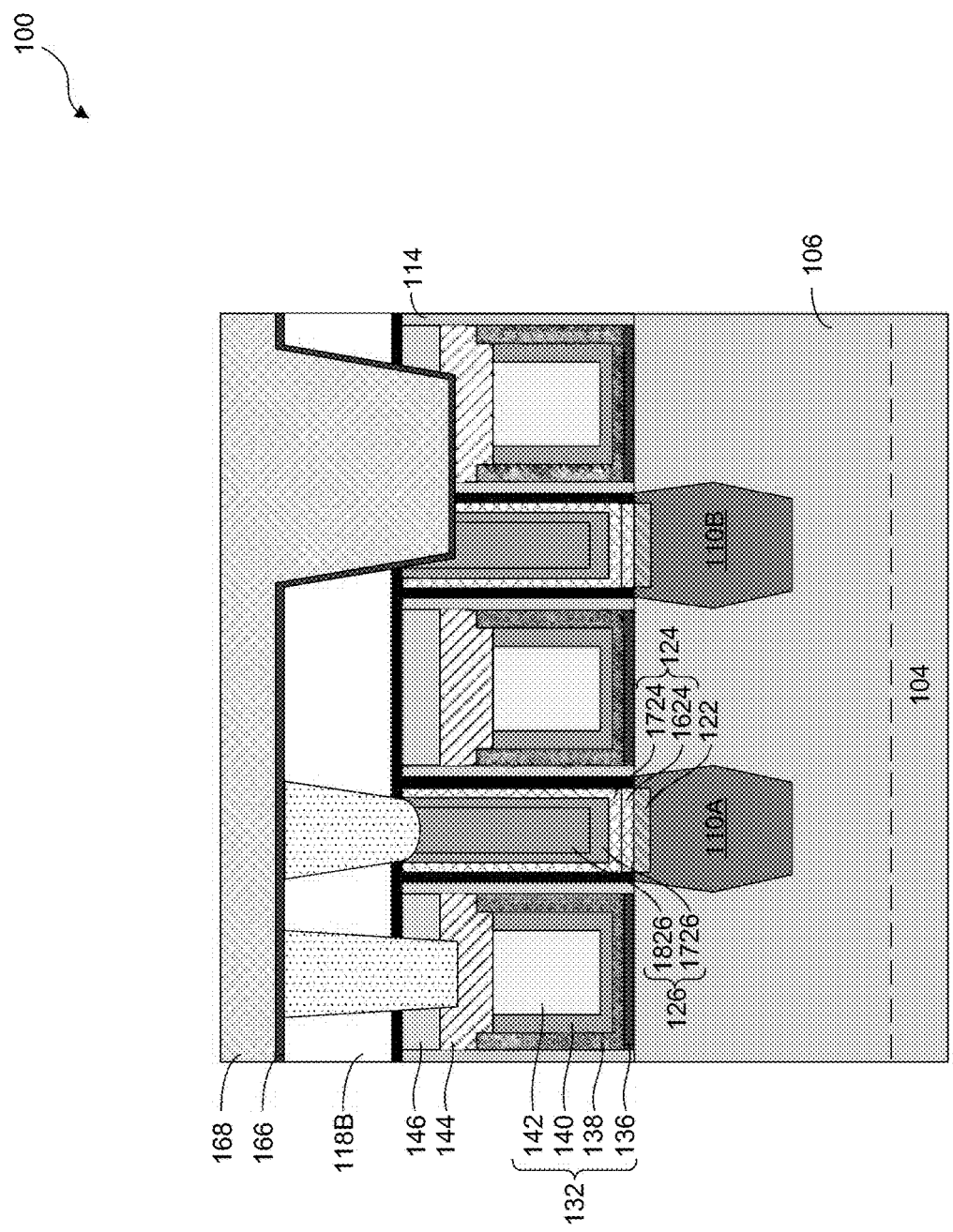
Figure 38:
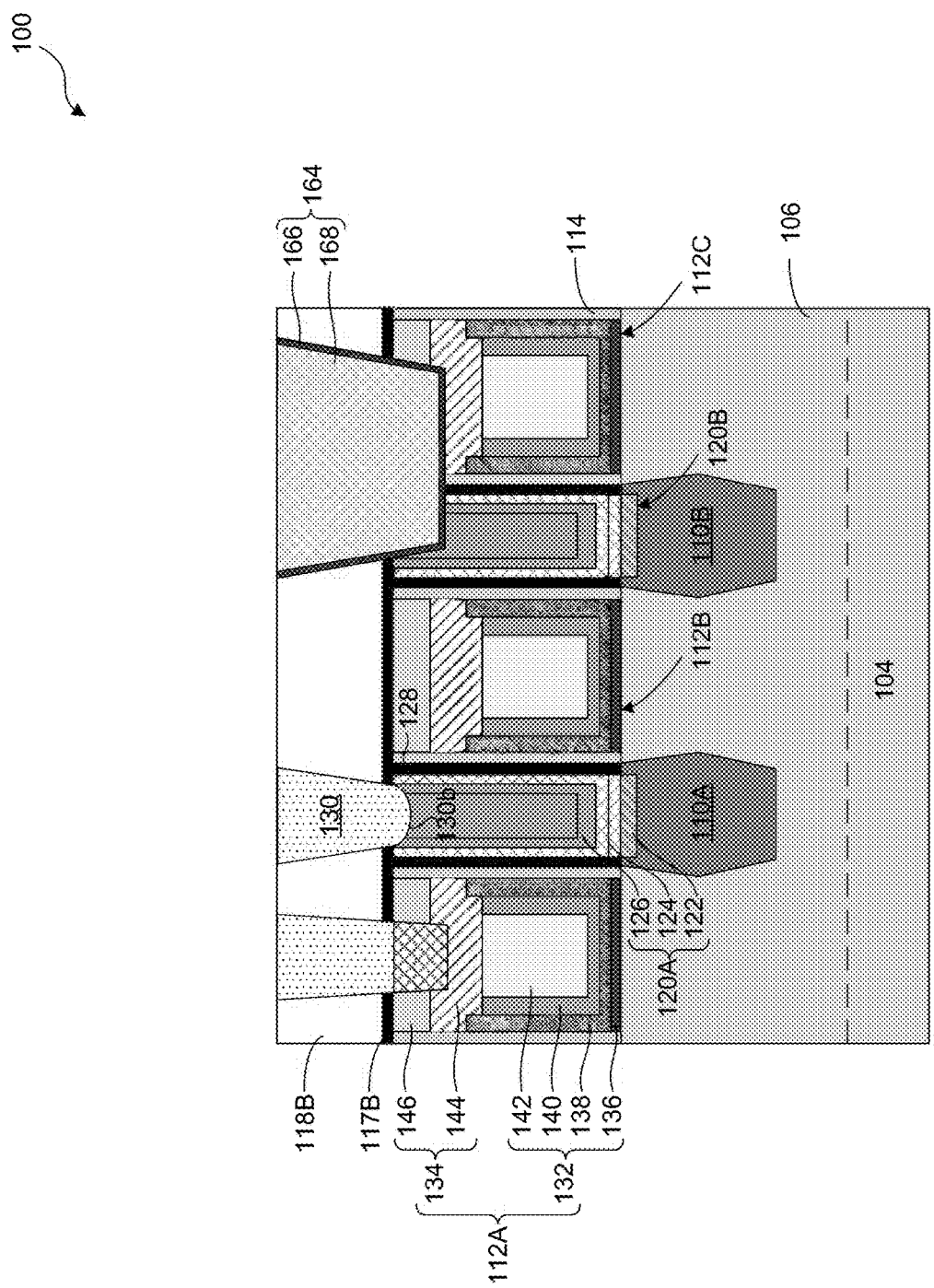

Referring to FIG. 34, in operation 3445, a merged via-contact structure is formed on a second one of the S/D contact structures and on a second one of the conductive gate caps. For example, as described with reference to FIGS. 36-38, merged via-contact structure 164 is formed on S/D contact structure 120B and conductive gate cap 144 of gate structure 112C. The formation of merged via-contact structure 164 can include sequential operations of (i) forming a contact openings 3694, as shown in FIG. 36, (ii) depositing adhesion layer 166 on the structure of FIG. 36, (iii) depositing contact plug 168 on adhesion layer 166, as shown in FIG. 37, and (iv) performing a CMP process on the structure of FIG. 37 to form the structure of FIG. 38.

The present disclosure provides example semiconductor devices (e.g., FET 100) with gate contact and via structures (e.g., gate contact structures 148 and gate via structures 150) on gate structures (e.g., gate structures 112A-112C). Further, the present disclosure provides example methods (e.g., methods 200 and 3400) of forming such semiconductor devices with reduced gate contact resistance between the gate structures and the gate contact and via structures. The gate contact and via structures are formed as separate structures in different deposition and/or growth processes in a gate contact opening on the gate structure. The gate contact structure is formed prior to the formation of the gate via structure and acts as a seed layer and/or a growth promoter layer for the growth of the gate via structure. The formation of the gate contact structure prior to the formation of the gate via structure reduces the aspect ratio of the gate contact opening (e.g., gate contact opening 2276) in which the gate via structure is formed. The formation of the gate via structure in the gate contact opening with the reduced aspect ratio substantially reduces or prevents the formation of defects, such as voids and seams within the gate via structures. The presence of such defects can increase the contact resistance between the gate contact and via structures, and consequently increase the gate contact resistance between the gate structure and the gate contact structure. The formation of the gate contact and via structure as separate structures in different deposition and/or growth processes can reduce the gate contact resistance by about 10% to about 50% compared to gate contact and via structures formed as a single structure with the same deposition and/or growth process in gate contact openings of similar dimensions.

In some embodiments, a semiconductor device includes a substrate, a fin structure disposed on the substrate, a source/drain (S/D) region disposed on the fin structure, and a gate structure disposed on the fin structure adjacent to the S/D region. The gate structure includes a gate stack disposed on the fin structure and a gate capping structure disposed on the gate stack. The gate capping structure includes a conductive gate cap disposed on the gate stack and an insulating gate cap disposed on the conductive gate cap. The semiconductor device further includes a first contact structure disposed within the gate capping structure and a first via structure disposed on the first contact structure.

In some embodiments, a semiconductor device includes a substrate, a fin structure disposed on the substrate, first and second S/D regions disposed on the fin structure, first and second S/D contact structures disposed on the first and second S/D regions, respectively, a S/D via structure disposed on the first S/D contact structure, and first and second gate structures disposed on the fin structure. Each of the first and second gate structures comprises a gate stack and a gate capping structure. The semiconductor device further includes a gate contact structure disposed within the gate capping structure of the first gate structure and a merged via-contact structure disposed on the second S/D contact structure and within the gate capping structure of the second gate structure.

In some embodiments, a method includes forming a fin structure on a substrate, forming a S/D region on the fin structure, forming a polysilicon structure on the fin structure, replacing the polysilicon structure with a gate stack, forming a gate capping structure on the gate stack, forming a first contact structure within the gate capping structure, and forming a first via structure on the first contact structure. The first contact structure is separated from the gate stack by a portion of the gate capping structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a fin structure disposed on the substrate;
   a source/drain (S/D) region disposed on the fin structure;
   a gate structure disposed on the fin structure adjacent to the S/D region,
   wherein the gate structure comprises a gate stack disposed on the fin structure and a gate capping structure disposed on the gate stack,
   wherein the gate capping structure comprises a conductive gate cap disposed on the gate stack and an insulating gate cap disposed on the conductive gate cap;
   a first contact structure disposed within the gate capping structure, wherein a top surface of the first contact structure is substantially coplanar with a top surface of the insulating gate cap; and
   a first via structure disposed on the first contact structure.

2. The semiconductor device of claim 1, wherein the first contact structure is separated from the gate stack by a portion of the conductive gate cap.

3. The semiconductor device of claim 1, wherein a first portion of the first contact structure is disposed within the conductive gate cap and a second portion of the first contact structure is disposed within the insulating gate cap.

4. The semiconductor device of claim 1, further comprising an etch stop layer disposed on the gate capping structure, wherein a portion of the first via structure is disposed within the etch stop layer.

5. The semiconductor device of claim 1, further comprising an interlayer dielectric (ILD) layer disposed over the gate capping structure, wherein a portion of the first via structure is disposed within the ILD layer.

6. The semiconductor device of claim 1, further comprising:
   an etch stop layer disposed on the gate capping structure; and
   an interlayer dielectric (ILD) layer disposed on the etch stop layer,
   wherein a first portion of the first via structure is disposed within the etch stop layer and a second portion of the first via structure is disposed within the ILD layer, and
   wherein the second portion is thicker than the first portion.

7. The semiconductor device of claim 1, wherein the first contact structure and the first via structure comprise materials different from each other.

8. The semiconductor device of claim 1, wherein a ratio of a thickness of the first contact structure to a thickness of the first via structure ranges from about 1:2 to about 1:6.

9. The semiconductor device of claim 1, wherein a ratio of a thickness of the conductive gate cap to a thickness of the insulating gate cap ranges from about 1:1 to about 1:2.

10. The semiconductor device of claim 1, further comprising a second contact structure on the S/D region.

11. The semiconductor device of claim 10, further comprising a second via structure on the second contact structure, wherein materials of the first and second via structures are same as each other.

12. A semiconductor device, comprising:
    a substrate;
    a fin structure disposed on the substrate;
    first and second source/drain (S/D) regions disposed on the fin structure;
    first and second S/D contact structures disposed on the first and second S/D regions, respectively;
    a S/D via structure disposed on the first S/D contact structure;

first and second gate structures disposed on the fin structure, wherein each of the first and second gate structures comprises a gate stack and a gate capping structure;

a gate contact structure disposed within the gate capping structure of the first gate structure; and a merged via-contact structure disposed on the second S/D contact structure and within the gate capping structure of the second gate structure, wherein a first portion of the merged via-contact structure is disposed in a conductive gate cap of the gate capping structure of the second gate structure.

13. The semiconductor device of claim 12, wherein a second portion of the merged via-contact structure is disposed with the in an insulating gate cap of the gate capping structure of the second gate structure.

14. The semiconductor device of claim 12, further comprising a gate via structure disposed on the gate contact structure.

15. A semiconductor device, comprising:
a substrate;
a source/drain (S/D) region disposed on the substrate;
a gate stack disposed on the substrate;
a capping structure disposed on the gate stack; and
a contact structure disposed in the capping structure, wherein the contact structure is separated from the gate stack by a portion of the capping structure, and wherein a top surface of the contact structure is substantially coplanar with a top surface of the capping structure.

16. The semiconductor device of claim 15, wherein the capping structure comprises:
a conductive gate cap disposed on the gate stack; and
an insulating gate cap disposed on the conductive gate cap.

17. The semiconductor device of claim 15, wherein the capping structure comprises a conductive gate cap and an insulation cap; and wherein a first portion of the contact structure is disposed in the conductive gate cap and a second portion of the contact structure is disposed in the insulating cap.

18. The semiconductor device of claim 15, wherein the capping structure comprises a T-shaped cross-sectional profile.

19. The semiconductor device of claim 12, wherein the gate contact structure and the merged via contact comprise materials different from each other.

20. The semiconductor device of claim 12, wherein sidewalls of the merged via contact is in contact with the second S/D contact structure.

* * * * *

UNITED STATES PATENT AND TRADEMARK OFFICE
CERTIFICATE OF CORRECTION

PATENT NO. : 12,002,885 B2
APPLICATION NO. : 17/470548
DATED : June 4, 2024
INVENTOR(S) : Cheng et al.

It is certified that error appears in the above-identified patent and that said Letters Patent is hereby corrected as shown below:

In the Specification

In Column 6, Line 54, after "compromising" delete "comprising".

In Column 6, Line 65, delete "Sift," and insert -- SO2, --, therefor.

In Column 13, Line 17, after "metal" delete "nitride".

In the Claims

In Column 17, Claim 13, Lines 13-14, after "disposed" delete "with the".

Signed and Sealed this
First Day of October, 2024

Katherine Kelly Vidal
*Director of the United States Patent and Trademark Office*